US009642138B2

(12) United States Patent
Yucek et al.

(10) Patent No.: US 9,642,138 B2
(45) Date of Patent: May 2, 2017

(54) SYSTEMS AND METHODS FOR FREQUENCY INTERLEAVING FOR WHITESPACE TRANSMISSION

(71) Applicant: Qualcomm Incorporated, San Diego, CA (US)

(72) Inventors: Tevfik Yucek, Santa Clara, CA (US); Hemanth Sampath, San Diego, CA (US); Vincent Knowles Jones, Redwood City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 317 days.

(21) Appl. No.: 13/789,433

(22) Filed: Mar. 7, 2013

(65) Prior Publication Data

US 2014/0016571 A1 Jan. 16, 2014

Related U.S. Application Data

(60) Provisional application No. 61/672,146, filed on Jul. 16, 2012.

(51) Int. Cl.
| | | |
|---|---|---|
| *H04W 4/00* | (2009.01) | |
| *H04W 72/04* | (2009.01) | |
| *H04L 1/00* | (2006.01) | |
| *H04L 1/06* | (2006.01) | |
| *H03M 13/27* | (2006.01) | |

(52) U.S. Cl.
CPC ... *H04W 72/0453* (2013.01); *H03M 13/2707* (2013.01); *H04L 1/0071* (2013.01); *H04L 1/06* (2013.01)

(58) Field of Classification Search
CPC ....... H04L 5/0032; H04L 1/06; H04L 1/0071; H04W 72/0453; H04W 72/04; H03M 13/2707
USPC ........................................................ 370/329
See application file for complete search history.

(56) References Cited

U.S. PATENT DOCUMENTS

| | | | | |
|---|---|---|---|---|
| 7,613,243 B2 * | 11/2009 | Ouyang | ................... | H04B 7/04 341/81 |
| 7,756,002 B2 | 7/2010 | Batra et al. | | |
| 2010/0254489 A1 | 10/2010 | Citta | | |

(Continued)

OTHER PUBLICATIONS

Ron et al (Interleaver parameter (Jul. 16, 2012) ( availability date is Jul. 13, 2012).*

(Continued)

*Primary Examiner* — Chi H Pham
*Assistant Examiner* — Abdeltif Ajid
(74) *Attorney, Agent, or Firm* — Kevin M. Donnelly

(57) ABSTRACT

Systems, methods, and devices to communicate in a white space are described herein. In some aspects, wireless communication transmitted in the white space authorizes an initial transmission by a device. The wireless communication may include power information for determining a power at which to transmit the initial transmission. The initial transmission may be used to request information identifying one or more channels in the white space available for transmitting data. In some aspects, a device for wireless communication is disclosed. The device may include a data interleaver with at least a first mode and a second mode. The modes may correspond to transmitting using either two or four channels of the white space.

8 Claims, 14 Drawing Sheets

(56) References Cited

U.S. PATENT DOCUMENTS

| | | | |
|---|---|---|---|
| 2011/0026623 A1* | 2/2011 | Srinivasa | H04L 1/0016 375/260 |
| 2012/0052827 A1* | 3/2012 | Sadek et al. | 455/226.1 |
| 2012/0063429 A1 | 3/2012 | Yang et al. | |
| 2012/0201316 A1 | 8/2012 | Zhang et al. | |
| 2013/0072106 A1* | 3/2013 | Koskela | H04W 16/14 455/3.01 |
| 2013/0301555 A1* | 11/2013 | Porat | H04L 1/0059 370/329 |

OTHER PUBLICATIONS

Srinivasa et al (11 ac 80 MHz transmission Flow (May 17, 2010)).*
Etsi, "Technical Report Satellite Earth Stations and Systems (SES); Advanced Satellite Based Scenarios and Architectures for Beyond 3G Systems", European Telecommunications Standards Institute. ETSI TR 102 662 V1.1.1 (Mar. 2010), 264pgs.
Vo, "802.11N Wireless Communication System Simulation Using Matlab and Implementation on FPGA", Worcester Polytechnic Institute Project No. XIH-0809, 2009, 134pgs.
International Search Report and Written Opinion—PCT/US2013/050749—ISA/EPO—Sep. 19, 2013.
Porat R., "Interleaver parameters IEEE 802.11-12/0839r0", Jul. 13, 2012, pp. 1-24, XP055078585.
Srinivasa et al., "11ac 80MHz Transmission Flow, 0548r2," IEEE 802.11 IEEE 802.11-10, May 17, 2010, pp. 1-23, XP002662817, Retrieved from the Internet: URL:https://mentor.ieee.org/802.11/dcn/10/11-10-0548-02-00ac-80mhz-transmission-flow.ppt&ei=8H-xTr6HB5GdOoG0-P4B&usg=AFQjCNHjf_MBw4HI59caqe50UoNDOFcfng&cad=rja [retrieved on Nov. 4, 2011] the whole document.
Tevfik Y., "11af Interleaver Parameters, IEEE 802.11-12/0908r1", Jul. 16, 2012, pp. 1-24, XP055078604, [retrieved on Sep. 10, 2013] the whole document.
Wookbong Lee (LG Electronics): "TGaf PHY proposal ; 11-12-0809-00-00af-tgaf-phy-proposal", IEEE SA Mentor; 11-12-0809-00-00af-tgaf-phy-proposal, IEEE-SA Mentor, Piscataway, NJ USA, vol. 802.11af, Jul. 11, 2012,pp. 1-43, XP068039312, [retrieved on Jul. 11, 2012] item 23. 3. 10. 8.
Wookbong Lee (LG Electronics): "TGaf PHY proposal ;11-12-0809-05-00af-tgaf-phy-proposal", IEEE SA Mentor; 11-12-0809-05-00af-tgaf-phy-proposal, IEEE-SA Mentor, Piscataway, NJ USA, vol. 802.11af, No. 5, Jul. 19, 2012, pp. 1-43, XP068039317, [retrieved on Jul. 19, 2012] item 23.3.10.8.

* cited by examiner

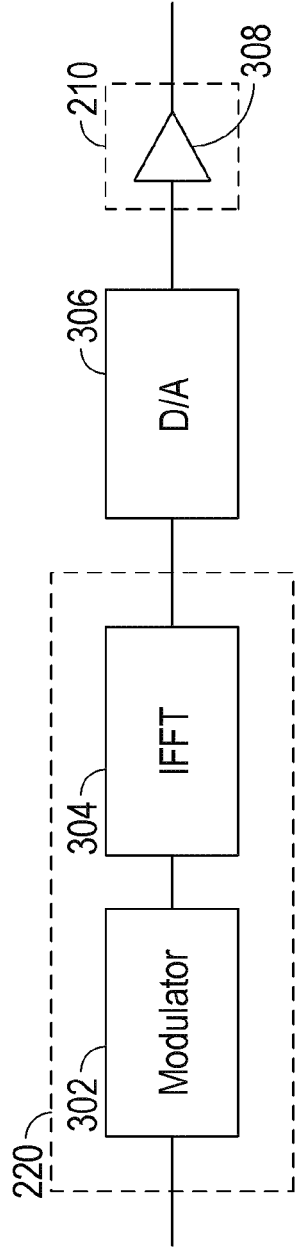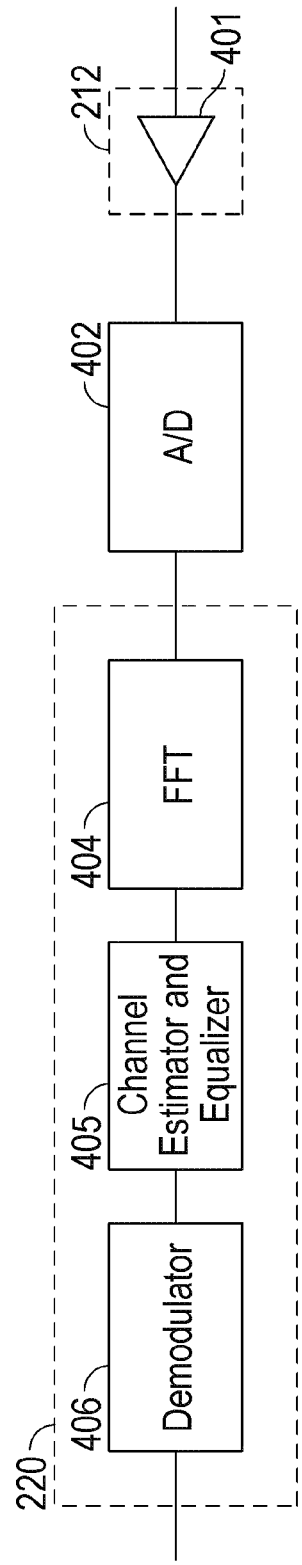

506

| Location | Frequency | Primary User Identifying | Power |
|---|---|---|---|
| Location A | Frequency Band 1 | Primary User Identifying Information A1 | Power Information A1 |
| | Frequency Band 2 | Primary User Identifying Information A2 | Power Information A2 |
| | ⋮ | ⋮ | ⋮ |
| | Frequency Band N | Primary User Identifying Information AN | Power Information AN |
| Location B | Frequency Band 1 | Primary User Identifying Information B1 | Power Information B1 |
| | Frequency Band 2 | Primary User Identifying Information B2 | Power Information B2 |
| | ⋮ | ⋮ | ⋮ |
| | Frequency Band N | Primary User Identifying Information BN | Power Information BN |
| ⋮ | ⋮ | ⋮ | ⋮ |
| Location Z | Frequency Band 1 | Primary User Identifying Information Z1 | Power Information Z1 |
| | Frequency Band 2 | Primary User Identifying Information Z2 | Power Information Z2 |
| | ⋮ | ⋮ | ⋮ |
| | Frequency Band N | Primary User Identifying Information ZN | Power Information ZN |

SYSTEMS AND METHODS FOR FREQUENCY INTERLEAVING FOR WHITESPACE TRANSMISSION

CLAIM OF PRIORITY UNDER 35 U.S.C. §119

This application claims priority to U.S. Provisional No. 61/672,146, titled "SYSTEMS AND METHODS FOR FREQUENCY INTERLEAVING FOR WHITESPACE TRANSMISSION," filed Jul. 16, 2012, which is hereby incorporated by reference in its entirety.

BACKGROUND

Field

The present application relates generally to wireless communications, and more specifically to systems, methods, and devices for communicating in a white space. For example, certain aspects herein may relate to communication in a television (TV) white space (TVWS).

Background

The popularity of high-rate wireless data services is increasing the demand for access to available frequency spectrum by both organized and ad hoc wireless networks. Ability to satisfy the demand is often limited by a lack of available frequency spectrum that may be used for reliable communications within a geographic area. Given the limitations of the natural frequency spectrum and models of licensing spectrum adopted in many countries, it is challenging to accommodate the increasing demand for spectrum access.

In many countries, the available frequency spectrum has been divided into a number of licensed and unlicensed frequency bands. Wireless cellular networks and some television channel transmissions typically operate in a licensed frequency band. For example, a network operator may be a licensee of a particular licensed band. As a licensee, the network operator may be allowed to exclude other potential users, for example so that non-authorized sources of interference are reduced.

A drawback of such licensed spectrum model is that it can lead to under-utilization of certain frequency bands. For example, there may be fewer licensees in certain areas than there are available licenses. Frequencies that are subject to license or otherwise allocated for use, but are unlicensed or unused in a certain area, may be referred to as a white space.

Communicating over one or more channels in the white space may increase the utilization of a frequency band, and/or may increase the efficiency of wireless communications. For example, one or more frequencies in the white space may be chosen for communication in order to take advantage of beneficial properties of the frequencies, and/or to alleviate congestion on other frequencies. Thus, improved systems, methods, and devices for communicating in a white space are desired.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description" one will understand how the features of this invention provide advantages.

In one aspect, a wireless communications apparatus is disclosed. The apparatus comprises a data interleaver configured to interleave encoded data and to output interleaved data for transmission, the interleaver comprising a plurality of spatial stream interleavers configured with at least a first mode and a second mode, wherein in the first mode the spatial stream interleavers are configured to set: a block size equal to 216, an interleaver depth equal to 27, and a base subcarrier rotation equal to 46; and wherein in the second mode, the spatial stream interleavers are configured to set: a block size equal to 432, an interleaver depth equal to 48, and a base subcarrier rotation equal to 78; and a transmit module configured to select at least one of the first mode and the second mode and transmit the interleaved data for transmission via the one or more spatial streams.

In another aspect, a method for interleaving data for wireless transmission is disclosed. The method comprises selecting one of a first mode and a second mode; interleaving encoded data and outputting interleaved data for transmission for one or more spatial streams, wherein in the first mode interleaving for the one or more spatial stream comprises: using a block size of 216, using an interleaver depth of 27, and using a base subcarrier rotation of 46; and wherein in the second mode, interleaving for the one or more spatial stream comprises: using a block size of 432, using an interleaver depth of 48, and using a base subcarrier rotation of 78; and transmitting the interleaved data for transmission via the one or more spatial streams.

Another aspect is a wireless communications apparatus. The apparatus comprises means for selecting one of a first mode and a second mode; means for interleaving encoded data and outputting interleaved data for transmission for one or more spatial streams, wherein in the first mode interleaving for the one or more spatial stream comprises: using a block size of 216, using an interleaver depth of 27, and using a base subcarrier rotation of 46; and wherein in the second mode, interleaving for the one or more spatial stream comprises: using a block size of 432, using an interleaver depth of 48, and using a base subcarrier rotation of 78; and means for transmitting the interleaved data for transmission via the one or more spatial streams.

Another aspect is a non-transitory computer-readable medium comprising code that, when executed, causes an apparatus to select one of a first mode and a second mode; interleave encoded data and outputting interleaved data for transmission for one or more spatial streams, wherein in the first mode interleaving for the one or more spatial stream comprises: using a block size of 216, using an interleaver depth of 27, and using a base subcarrier rotation of 46; and wherein in the second mode, interleaving for the one or more spatial stream comprises: using a block size of 432, using an interleaver depth of 48, and using a base subcarrier rotation of 78; and transmit the interleaved data for transmission via the one or more spatial streams.

Another aspect is a wireless communications apparatus. The apparatus comprises a receive module configured to receive data via one or more spatial streams; and a deinterleaver configured deinterleave the received data, the deinterleaver comprising one or more spatial stream deinterleavers corresponding to one or more spatial streams configured with at least a first mode and a second mode, wherein in the first mode, the one or more spatial stream deinterleavers are configured to set: a block size equal to 216, an interleaver depth equal to 27, and a base subcarrier rotation equal to 46; and wherein in the second mode, the one or more spatial stream deinterleavers are configured to set: a block size equal to 432, an interleaver depth equal to 48, and a base subcarrier rotation equal to 78.

Another aspect is a method for deinterleaving data. The method comprises receiving data via one or more spatial streams; and deinterleaving the received data and output deinterleaved data for the one or more spatial streams in at least one of a first mode and a second mode, wherein deinterleaving for the one or more spatial stream in the first mode comprises: using a block size of 216, using an interleaver depth of 27, and using a base subcarrier rotation of 46; and wherein deinterleaving for the one or more spatial stream in the second mode comprises: using a block size of 432, using an interleaver depth of 48, and using a base subcarrier rotation of 78.

Another aspect is a wireless communications apparatus comprising means for receiving data configured to receive data via one or more spatial streams; and means for deinterleaving data configured to deinterleave the received data, the means for deinterleaving comprising one or more means for deinterleaving streams corresponding to one or more spatial streams configured with at least a first mode and a second mode, wherein in the first mode the one or more means for deinterleaving streams are configured to set: a block size equal to 216, an interleaver depth equal to 27, and a base subcarrier rotation equal to 46; and wherein in the second mode the one or more means for deinterleaving streams are configured to set: a block size equal to 432, an interleaver depth equal to 48, and a base subcarrier rotation equal to 78.

Another aspect is a non-transitory computer-readable medium comprising code that, when executed, causes an apparatus to receive data via one or more spatial streams; and deinterleave the received data and output deinterleaved data for the one or more spatial streams in at least one of a first mode and a second mode, wherein deinterleaving for the one or more spatial stream in the first mode comprises: using a block size of 216, using an interleaver depth of 27, and using a base subcarrier rotation of 46, and wherein deinterleaving for the one or more spatial stream in the second mode comprises: using a block size of 432, using an interleaver depth of 48, and using a base subcarrier rotation of 78.

BRIEF DESCRIPTION OF THE DRAWINGS

FIG. 3 shows a functional block diagram of exemplary components that may be utilized in the wireless device of FIG. 2 to transmit wireless communications.

FIG. 4 shows a functional block diagram of exemplary components that may be utilized in the wireless device of FIG. 2 to receive wireless communications.

FIG. 6 is a representation of an aspect of the database of FIG. 3.

Figure 1:
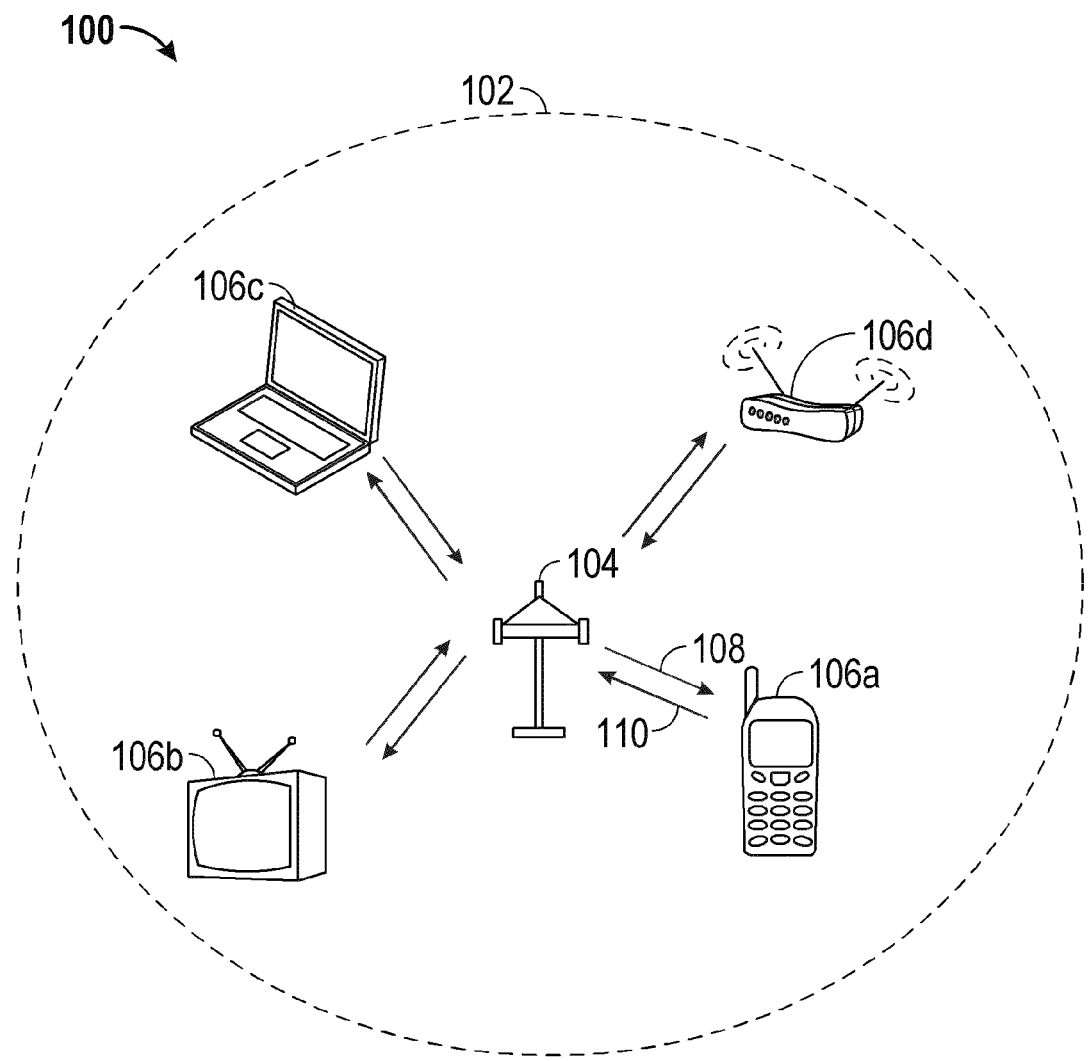
FIG. 1 illustrates an example of a wireless communication system in which aspects of the present disclosure may be employed.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method, or device. Similarly, some of the drawings may depict more components than a given system, method, or device actually implements. Further, like reference numerals may be used to denote like features throughout the specification and figures.

DETAILED DESCRIPTION

Various aspects of the novel systems, apparatuses, and methods are described more fully hereinafter with reference to the accompanying drawings. The teachings disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, IEEE 802.22, Flash-OFDMA, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). Similarly, cdma2000 is described in documents from an organization named "3rd Generation Partnership Project 2" (3GPP2).

The aspects described herein may be used in conjunction with a white space comprising frequencies that are defined for licensing to television (TV) broadcasters. Such white space may be referred to as TV white space (TVWS). In some aspects, aspects of the devices and methods described herein may implement a standard such as 802.11af, for example using OFDM. In some aspects, the devices and methods described herein may implement a standard such as 802.11z or one of the 802.22 standards. By way of example only, the devices and methods herein will be described consistent with the 802.11af standard and a TVWS. Those having ordinary skill in the art will appreciate, however, that the systems, methods, and devices described herein may be used in conjunction with standards other than 802.11af and with a white space other than a TVWS.

In some aspects the teachings herein may be employed in a network that includes macro scale coverage (e.g., a large area cellular network such as a 3G network, typically referred to as a macro cell network, or a broadcast network such as may be used by television broadcasters) and smaller scale coverage (e.g., a residence-based or building-based network environment). As an access terminal (AT) or user equipment (UE) moves through such a network, the access terminal may be served in certain locations by access nodes (ANs) that provide macro coverage while the access terminal may be served at other locations by access nodes that provide smaller scale coverage. In some aspects, the smaller coverage nodes may be used to provide incremental capacity growth, in-building coverage, and different services (e.g., for a more robust user experience). In the discussion herein, a node that provides coverage over a relatively large area may be referred to as a macro node. A node that provides coverage over a relatively small area (e.g., a residence) may be referred to as a femto node. A node that provides coverage over an area that is smaller than a macro area and larger than a femto area may be referred to as a pico node (e.g., providing coverage within a commercial building).

In some aspects, an access node may comprise an access point ("AP") and/or a client (also referred to as a station or "STA"). In general, an AP serves as a hub or base station for a network and an STA serves as a user of the network. For example, an STA may be a laptop computer, a personal digital assistant (PDA), a mobile phone, etc. In an example, an STA connects to an AP via a WiFi (e.g., IEEE 802.11 protocol) compliant wireless link to obtain general connectivity to the Internet or to other wide area networks. In some implementations an STA may also be used as an AP. In some aspects, a WiFi protocol that accesses or utilizes a white space such as a TVWS may be referred to as a White-Fi protocol.

A station "STA" may also comprise, be implemented as, or known as an access terminal ("AT" as discussed above), a subscriber station, a subscriber unit, a mobile station, a remote station, a remote terminal, a user terminal, a user agent, a user device, user equipment, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

An access point ("AP") may also comprise, be implemented as, or known as a NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, or some other terminology.

A cell associated with a macro node, a femto node, or a pico node may be referred to as a macro cell, a femto cell, or a pico cell, respectively. In some implementations, each cell may be further associated with (e.g., divided into) one or more sectors.

In various applications, other terminology may be used to reference a macro node, a femto node, or a pico node. For example, a macro node may be configured or referred to as an access node, base station, access point, eNodeB, macro cell, and so on. Also, a femto node may be configured or referred to as a Home NodeB (HNB), Home eNodeB (HeNB), access point base station, femto cell, and so on.

As discussed above, the white space in a system may be under-utilized. Under-utilized portions of frequency spectrum may also sometimes be referred to as spectral holes.

Spectrum sharing allows unlicensed users access to licensed portions of frequency spectrum when there is no licensed transmitter or user for a respective licensed frequency band at a given time and/or in a particular geographic location. In some aspects, an unlicensed user may be able to lookup or otherwise detect times when a specific licensed band is unused in a particular area and then use the band for communication without causing significant interference to transmissions of a license-holder.

FIG. 1 illustrates an example of a wireless communication system 100 in which aspects of the present disclosure may be employed. The wireless communication system 100 may operate pursuant to a wireless standard, for example the 802.11af standard. The wireless communication system 100 may include an AP 104, which communicates with STAs 106.

A variety of processes and methods may be used for transmissions in the wireless communication system 100 between the AP 104 and the STAs 106. For example, signals may be sent and received between the AP 104 and the STAs 106 in accordance with OFDM/OFDMA techniques. If this is the case, the wireless communication system 100 may be referred to as an OFDM/OFDMA system. Alternatively, signals may be sent and received between the AP 104 and the STAs 106 in accordance with CDMA techniques. If this is the case, the wireless communication system 100 may be referred to as a CDMA system.

A communication link that facilitates transmission from the AP 104 to one or more of the STAs 106 may be referred to as a downlink (DL) 108, and a communication link that facilitates transmission from one or more of the STAs 106 to the AP 104 may be referred to as an uplink (UL) 110. Alternatively, a downlink 108 may be referred to as a forward link or a forward channel, and an uplink 110 may be referred to as a reverse link or a reverse channel.

The AP 104 may act as a base station and provide wireless communication coverage in a basic service area (BSA) 102. The AP 104 along with the STAs 106 associated with the AP 104 and that use the AP 104 for communication may be referred to as a basic service set (BSS). It should be noted that the wireless communication system 100 may not have a central AP 104, but rather may function as a peer-to-peer network between the STAs 106. Accordingly, the functions of the AP 104 described herein may alternatively be performed by one or more of the STAs 106.

Figure 2:
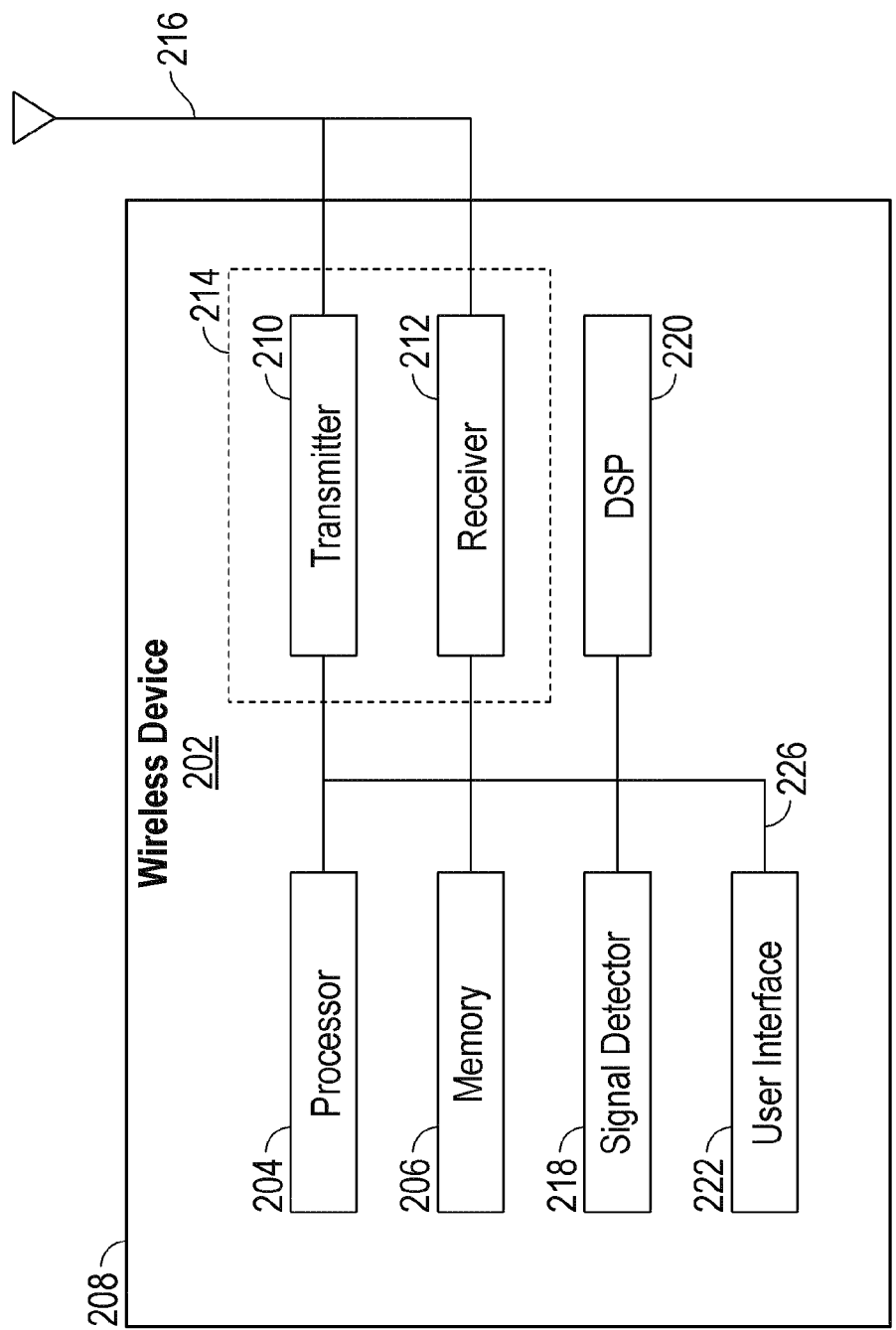
FIG. 2 shows a functional block diagram of an exemplary wireless device that may be employed within the wireless communication system of FIG. 1.

FIG. 2 illustrates various components that may be utilized in a wireless device 202 that may be employed within the wireless communication system 100. The wireless device 202 is an example of a device that may be configured to implement the various methods described herein. For example, the wireless device 202 may comprise the AP 104 or one of the STAs 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals. The DSP 220 may be configured to generate a data unit for transmission. In some aspects, the data unit may comprise a physical layer data unit (PPDU). In some aspects, the PPDU is referred to as a packet.

The wireless device 202 may further comprise a user interface 222 in some aspects. The user interface 222 may comprise a keypad, a microphone, a speaker, and/or a display. The user interface 222 may include any element or component that conveys information to a user of the wireless device 202 and/or receives input from the user.

The various components of the wireless device 202 may be coupled together by a bus system 226. The bus system 226 may include a data bus, for example, as well as a power bus, a control signal bus, and a status signal bus in addition to the data bus. Those of skill in the art will appreciate the components of the wireless device 202 may be coupled together or accept or provide inputs to each other using some other mechanism.

Although a number of separate components are illustrated in FIG. 2, those of skill in the art will recognize that one or more of the components may be combined or commonly implemented. For example, the processor 204 may be used to implement not only the functionality described above with respect to the processor 204, but also to implement the functionality described above with respect to the signal detector 218 and/or the DSP 220. Further, each of the components illustrated in FIG. 2 may be implemented using a plurality of separate elements.

As discussed above, the wireless device 202 may comprise an AP 104 or an STA 106, and may be used to transmit and/or receive communications. FIG. 3 illustrates various components that may be utilized in the wireless device 202 to transmit wireless communications. The components illustrated in FIG. 3 may be used, for example, to transmit OFDM communications. In some aspects, the components illustrated in FIG. 3 are used to transmit data units with training fields with peak-to-power average ratio is as low as possible, as will be discussed in additional detail below. For ease of reference, the wireless device 202 configured with the components illustrated in FIG. 3 is hereinafter referred to as a wireless device 202a.

The wireless device 202a may comprise a modulator 302 configured to modulate bits for transmission. For example, the modulator 302 may determine a plurality of symbols from bits received from the processor 204 or the user interface 222, for example by mapping bits to a plurality of symbols according to a constellation. The bits may correspond to user data or to control information. In some aspects, the bits are received in codewords. In one aspect, the modulator 302 comprises a QAM (quadrature amplitude modulation) modulator, for example a 16-QAM modulator or a 64-QAM modulator. In other aspects, the modulator 302 comprises a binary phase-shift keying (BPSK) modulator or a quadrature phase-shift keying (QPSK) modulator.

The wireless device 202a may further comprise a transform module 304 configured to convert symbols or otherwise modulated bits from the modulator 302 into a time domain. In FIG. 3, the transform module 304 is illustrated as being implemented by an inverse fast Fourier transform (IFFT) module. In some implementations, there may be multiple transform modules (not shown) that transform units of data of different sizes.

In FIG. 3, the modulator 302 and the transform module 304 are illustrated as being implemented in the DSP 220. In some aspects, however, one or both of the modulator 302 and the transform module 304 are implemented in the processor 204 or in another element of the wireless device 202.

As discussed above, the DSP 220 may be configured to generate a data unit for transmission. In some aspects, the modulator 302 and the transform module 304 may be configured to generate a data unit comprising a plurality of fields including control information and a plurality of data symbols. The fields including the control information may comprise one or more training fields, for example, and one or more signal (SIG) fields. Each of the training fields may include a known sequence of bits or symbols. Each of the SIG fields may include information about the data unit, for example a description of a length or data rate of the data unit.

Returning to the description of FIG. 3, the wireless device 202a may further comprise a digital to analog converter 306 configured to convert the output of the transform module into an analog signal. For example, the time-domain output of the transform module 306 may be converted to a baseband OFDM signal by the digital to analog converter 306. The digital to analog converter 306 may be implemented in the processor 204 or in another element of the wireless device 202. In some aspects, the digital to analog converter 306 is implemented in the transceiver 214 or in a data transmit processor.

The analog signal may be wirelessly transmitted by the transmitter 210. The analog signal may be further processed before being transmitted by the transmitter 210, for example by being filtered or by being upconverted to an intermediate or carrier frequency. In the aspect illustrated in FIG. 3, the transmitter 210 includes a transmit amplifier 308. Prior to being transmitted, the analog signal may be amplified by the transmit amplifier 308. In some aspects, the amplifier 308 comprises a low noise amplifier (LNA).

The transmitter 210 is configured to transmit one or more packets or data units in a wireless signal based on the analog signal. The data units may be generated using the processor 204 and/or the DSP 220, for example using the modulator 302 and the transform module 304 as discussed above. Data units that may be generated and transmitted as discussed above are described in additional detail below with respect to FIGS. 5-10.

FIG. 4 illustrates various components that may be utilized in the wireless device 202 to receive wireless communications. The components illustrated in FIG. 4 may be used, for example, to receive OFDM communications. In some aspects, the components illustrated in FIG. 4 are used to receive data units that include one or more training fields, as will be discussed in additional detail below. For example, the components illustrated in FIG. 4 may be used to receive data units transmitted by the components discussed above with respect to FIG. 3. For ease of reference, the wireless device 202 configured with the components illustrated in FIG. 4 is hereinafter referred to as a wireless device 202b.

The receiver 212 is configured to receive one or more packets or data units in a wireless signal. Data units that may be received and decoded.

In the aspect illustrated in FIG. 4, the receiver 212 includes a receive amplifier 401. The receive amplifier 401 may be configured to amplify the wireless signal received by the receiver 212. In some aspects, the receiver 212 is configured to adjust the gain of the receive amplifier 401 using an automatic gain control (AGC) procedure. In some aspects, the automatic gain control uses information in one or more received training fields, such as a received short training field (STF) for example, to adjust the gain. Those having ordinary skill in the art will understand methods for performing AGC. In some aspects, the amplifier 401 comprises an LNA.

The wireless device 202b may comprise an analog to digital converter 402 configured to convert the amplified wireless signal from the receiver 212 into a digital representation thereof. Further to being amplified, the wireless signal may be processed before being converted by the digital to analog converter 402, for example by being filtered or by being downconverted to an intermediate or baseband frequency. The analog to digital converter 402 may be implemented in the processor 204 or in another element of the wireless device 202. In some aspects, the analog to digital converter 402 is implemented in the transceiver 214 or in a data receive processor.

The wireless device 202b may further comprise a transform module 404 configured to convert the representation the wireless signal into a frequency spectrum. In FIG. 4, the transform module 404 is illustrated as being implemented by a fast Fourier transform (FFT) module. In some aspects, the transform module may identify a symbol for each point that it uses.

The wireless device 202b may further comprise a channel estimator and equalizer 405 configured to form an estimate of the channel over which the data unit is received, and to remove certain effects of the channel based on the channel estimate. For example, the channel estimator may be configured to approximate a function of the channel, and the channel equalizer may be configured to apply an inverse of that function to the data in the frequency spectrum.

In some aspects, the channel estimator and equalizer 405 uses information in one or more received training fields, such as a long training field (LTF) for example, to estimate the channel. The channel estimate may be formed based on one or more LTFs received at the beginning of the data unit. This channel estimate may thereafter be used to equalize data symbols that follow the one or more LTFs. After a certain period of time or after a certain number of data symbols, one or more additional LTFs may be received in the data unit. The channel estimate may be updated or a new estimate formed using the additional LTFs. This new or update channel estimate may be used to equalize data symbols that follow the additional LTFs. In some aspects, the new or updated channel estimate is used to re-equalize data symbols preceding the additional LTFs. Those having ordinary skill in the art will understand methods for forming a channel estimate.

The wireless device 202b may further comprise a demodulator 406 configured to demodulate the equalized data. For example, the demodulator 406 may determine a plurality of bits from symbols output by the transform module 404 and the channel estimator and equalizer 405, for example by reversing a mapping of bits to a symbol in a constellation. The bits may be processed or evaluated by the processor 204, or used to display or otherwise output information to the user interface 222. In this way, data and/or information may be decoded. In some aspects, the bits correspond to codewords. In one aspect, the demodulator 406 comprises a QAM (quadrature amplitude modulation) demodulator, for example a 16-QAM demodulator or a 64-QAM demodulator. In other aspects, the demodulator 406 comprises a binary phase-shift keying (BPSK) demodulator or a quadrature phase-shift keying (QPSK) demodulator.

In FIG. 4, the transform module 404, the channel estimator and equalizer 405, and the demodulator 406 are illustrated as being implemented in the DSP 220. In some aspects, however, one or more of the transform module 404, the channel estimator and equalizer 405, and the demodulator 406 are implemented in the processor 204 or in another element of the wireless device 202.

As discussed above, the wireless signal received at the receiver 212 comprises one or more data units. Using the functions or components described above, the data units or data symbols therein may be decoded evaluated or otherwise evaluated or processed. For example, the processor 204 and/or the DSP 220 may be used to decode data symbols in the data units using the transform module 404, the channel estimator and equalizer 405, and the demodulator 406.

Data units exchanged by the AP 104 and the STA 106 may include control information or data, as discussed above. At the physical (PHY) layer, these data units may be referred to as physical layer protocol data units (PPDUs). In some aspects, a PPDU may be referred to as a packet or physical layer packet. Each PPDU may comprise a preamble and a payload. The preamble may include training fields and a SIG field. The payload may comprise a Media Access Control (MAC) header or data for other layers, and/or user data, for example. The payload may be transmitted using one or more data symbols. The systems, methods, and devices herein may utilize data units with training fields whose peak-to-power ratio has been minimized.

When using OFDM, information using a number of orthogonal subcarriers of the frequency band being used. The number of subcarriers that are used may depend on a variety of considerations including the available frequency bands for use, bandwidth and any associated regulatory constraints. The number of subcarriers used is correlated to the size of an FFT module as each modulated subcarrier is an input to an IFFT module to create the OFDM signal to be transmitted. As such, in some implementations a larger FFT size (e.g., 64, 128, 256, 512) may, corresponding to transmitting data using more subcarriers, be desired to achieve a larger bandwidth. In other implementations, a smaller FFT size may be used for transmitting data in a narrow bandwidth. The number of subcarriers, and therefore FFT size, may be chosen so as to comply with regulatory domains with certain bandwidth restrictions. As such, the wireless device 202*a* may include a several transform modules 304 implemented as an FFT or IFFT module, each of different sizes so as to comply with the number of subcarriers specified to be used. At least one of the transform modules 304 may be a 32 point size IFFT or FFT module according to certain aspects described herein.

Given lossy wireless communication mediums, various components may be included within a wireless communication device 200 to ensure that signals can be largely recovered correctly. One technique is the use of error correction. With error correction, when a bit or bits are lost, they might be recovered using other bits that were not lost according to whatever error correction coding was done. As error correction may not be able to correct all errors, some error conditions might cause unrecoverable errors. For example, if four information bits are encoded into seven transmitted bits using a Reed-Solomon error correcting encoding, if any four of the seven transmitted bits are recovered, then the four information bits can be determined. However, if more than three of the transmitted bits are lost, the full information cannot be recovered. Note that if there are several such encodings, information is lost when four bits are lost if they all are lost out of one encoding, but if four bits are lost with two bits lost per encoding, the information is recoverable. One approach to spreading potential losses is interleaving.

As discussed above, one example of an under-utilized frequency spectrum may include a TV frequency band. The TV frequency band may display excellent signal to noise characteristics in certain aspects, for example when occupying a frequency space above 100 Mhz. Thus, unlicensed channels may include television channels that have not been licensed to a broadcaster, and are referred to herein as TVWS. For example, the transition from analog broadcast of television programming to digital broadcast freed previously used spectrum which may now comprise TVWS.

Before a device transmits in a TVWS, the device may check that a TV channel is empty from licensed transmitters and/or other primary users. In certain aspects, primary are the users who have higher priority or legacy rights on the usage of a specific part of the TV spectrum. For example, wireless microphone systems may be considered as primary users in certain aspects of the wireless communications system 100.

In some aspects, a device that desires to transmit in the TVWS may infer the presence or absence of the TV primary users through communication with a database having registered primary user information, and/or through spectrum sensing in certain aspects. Certain regulatory schemes contemplate a database populated by all primary users of a particular frequency band at a given geo-location, for example as may be managed by the FCC or other body or agency.

In some aspects, a device that desires to communicate in the TVWS may be configured to determine its geo-location within a certain accuracy, for example fifty meters, to determine whether a TV channel is empty from TV primary users registered in the database. Some devices that desire to communicate in the TCWS, however, may not be able or may select not to determine such an accurate geo-location. For example, a device may not be equipped with such geo-location determination capability, or may be in a location that does not allow for the determination of the geo-location to the degree of accuracy.

Figure 5:
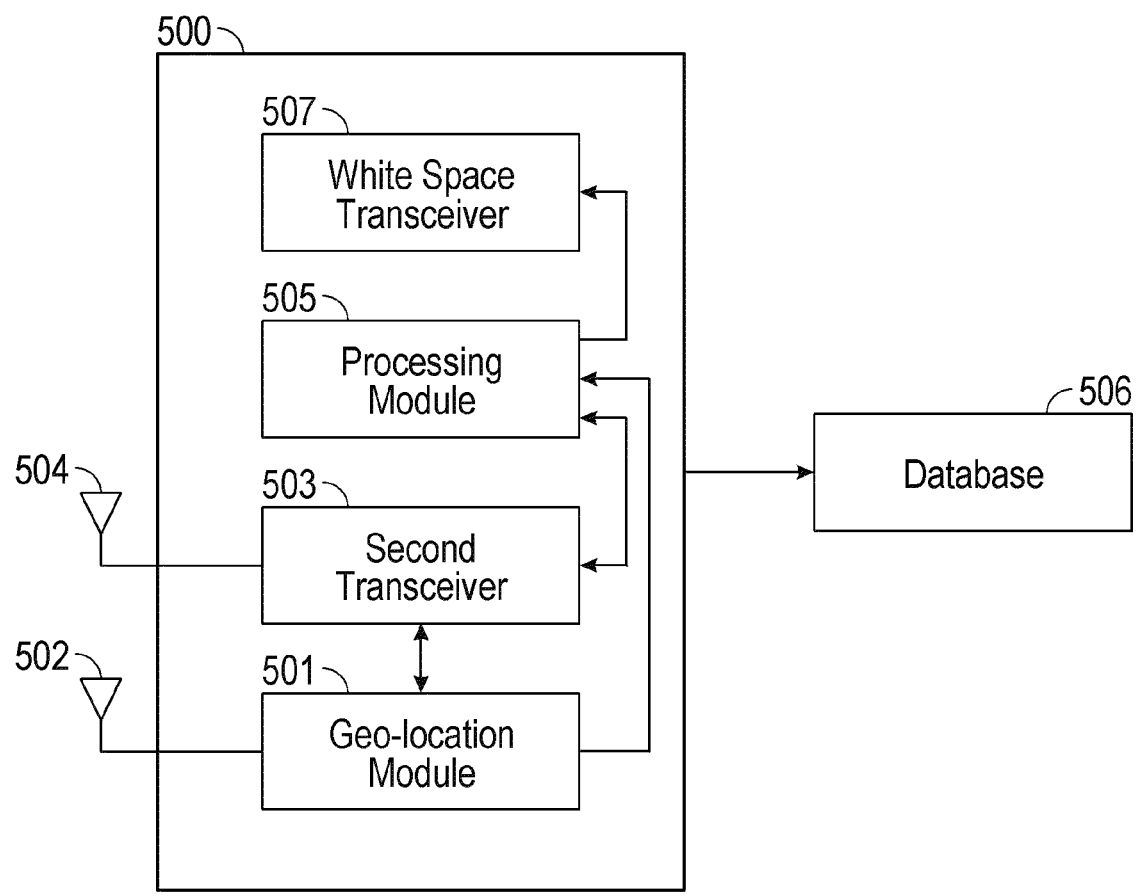
FIG. 5 is a functional block diagram of an aspect of a device that may be employed within the wireless communication system of FIG. 1, which device is in communication with a database.

FIG. 5 is a functional block diagram of an aspect of a wireless communication device 500 that may be employed within the wireless communication system of FIG. 1. The device 500 may include a geo-location module 501, a geo-location antenna 502, a processing module 505, a white space transceiver 507, a second transceiver 503, and/or a second antenna 504. In some aspects, the geo-location module 501 and the second transceiver 505 may both use a common antenna instead of two separate antennas, as illustrated in FIG. 5. In some aspects, the second antenna 504 may be omitted, for example when the second transceiver 503 is configured to send and receive information over a wired connection. One or more of the above described components of wireless communication device 500 may communicate with database 506.

FIG. 6 is a representation of an aspect of the database 506 illustrated in FIG. 5. The database 506 may include information regarding frequencies or communication channels in a licensed frequency band or spectrum. For example, the database 506 may include information about a TV frequency band. In some aspects, the database 506 may comprise user information identifying users transmitting in the frequency bands. The user information may include information, for example, regarding one or more licensed or primary users of a particular frequency band. The user information may include one or more of a signal strength, primary user geo-location, a frequency associated with a user, or a particular frequency band or channel for user communication. In some aspects, the user information relates to devices that have registered, been authorized, or been enabled for transmitting in a channel in white space. In some aspects, the user information may include information identifying one or more devices that are not allowed to transmit in the system 100 or in particular channels of the system 100 or in particular channels of the white space. The system 100 may include any number users over a given channel in some aspects. Additionally and/or alternatively, a hierarchy of priority among the users can be applied such that a user having a higher priority to a channel is not interfered with by a user having a lower priority over the channel.

Figure 7:
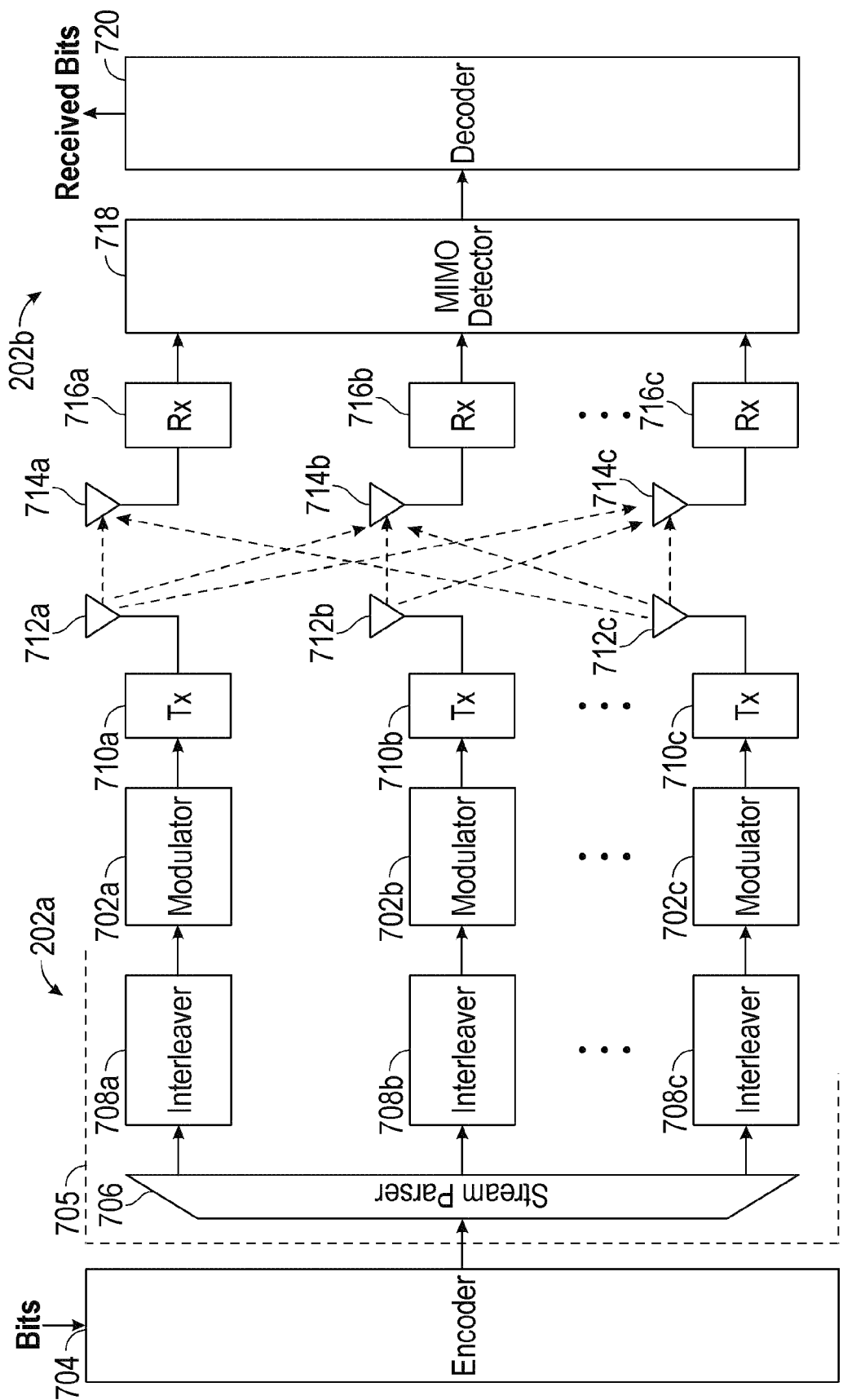
FIG. 7 is a functional block diagram of a MIMO system that may be implemented in wireless devices such as the wireless device of FIG. 2 to transmit and receive wireless communications.
Figure 8:
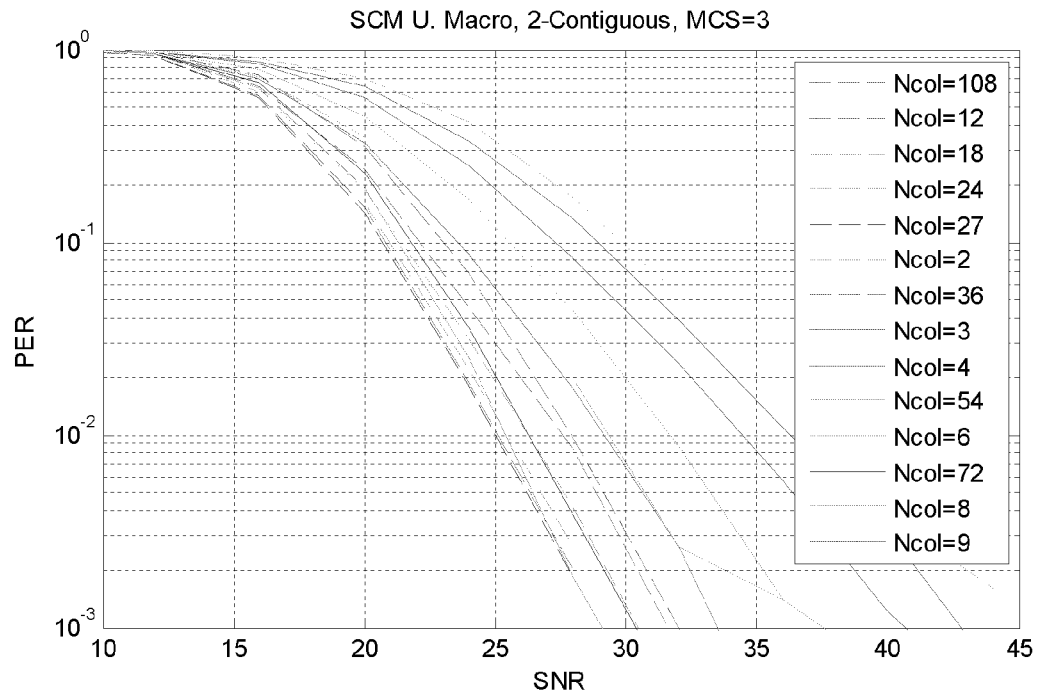
FIGS. 8-15 are plots showing examples of simulations of the performance for various selections of $N_{COL}$ with plots showing the signal-to-noise ratio (SNR) versus the packet error rate (PER).
Figure 9:
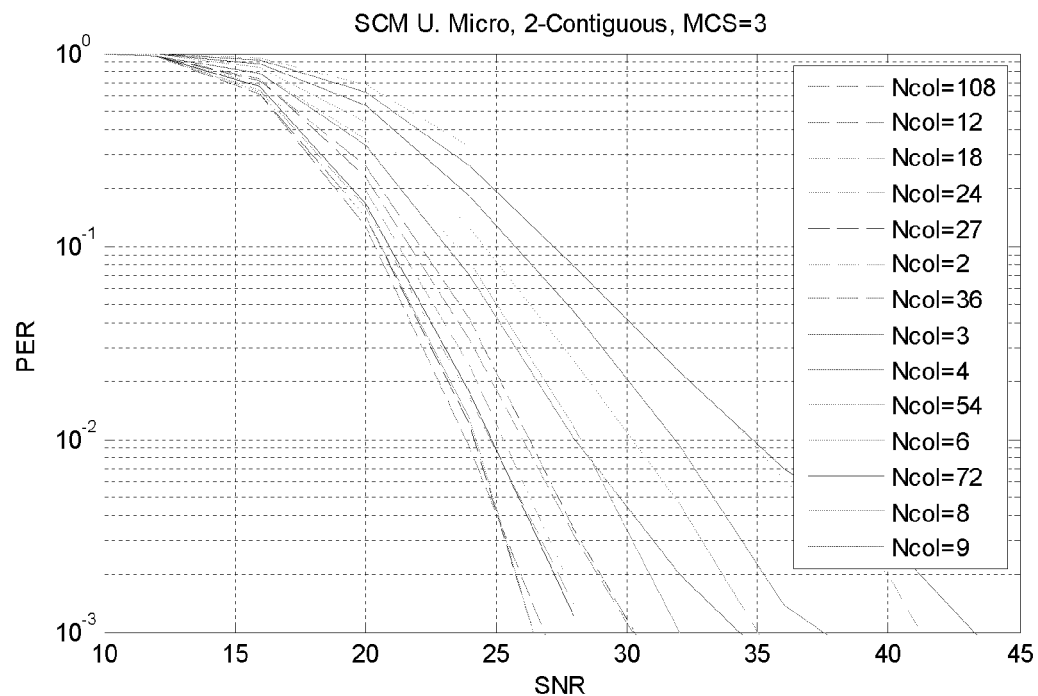
Figure 10:
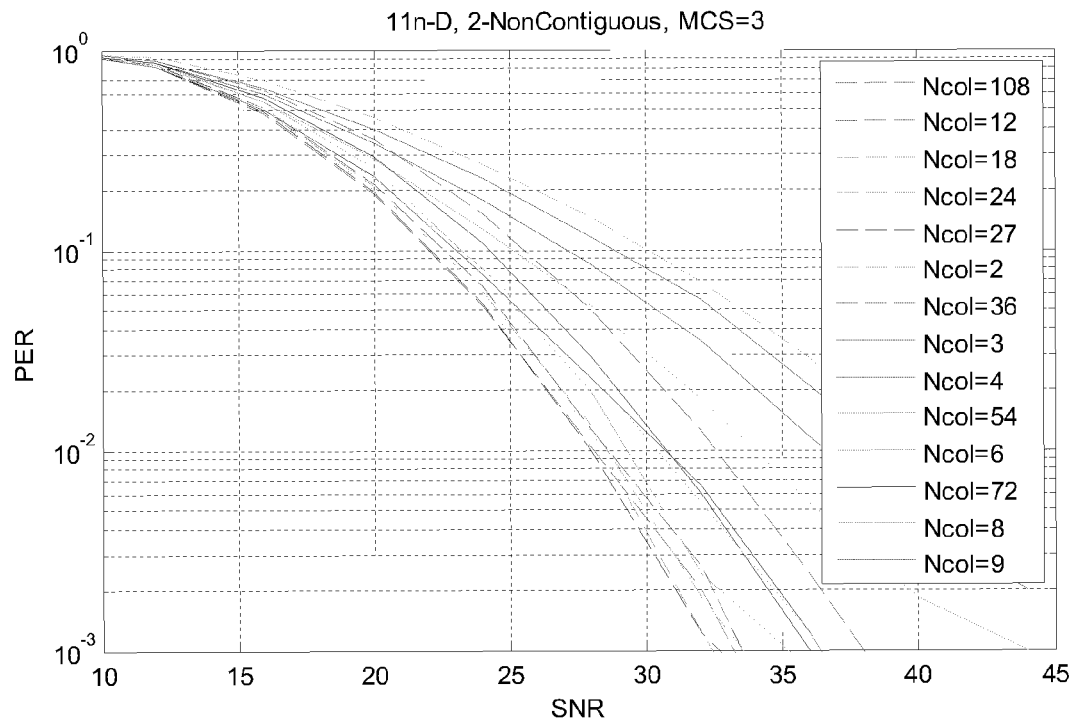
Figure 11:
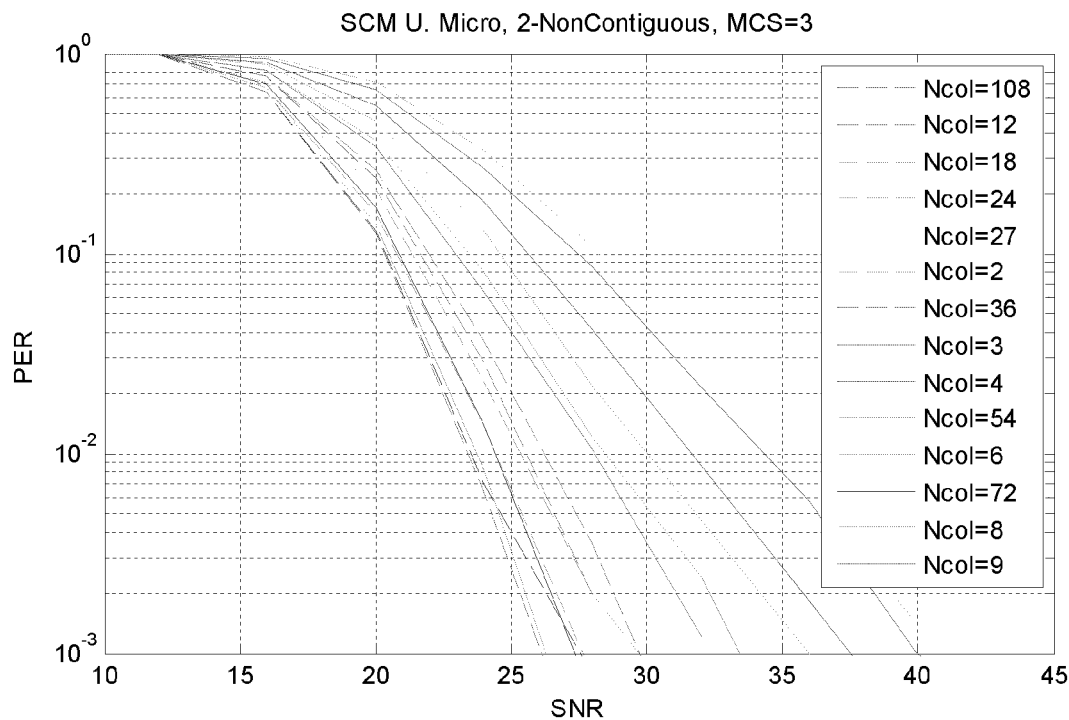
Figure 12:
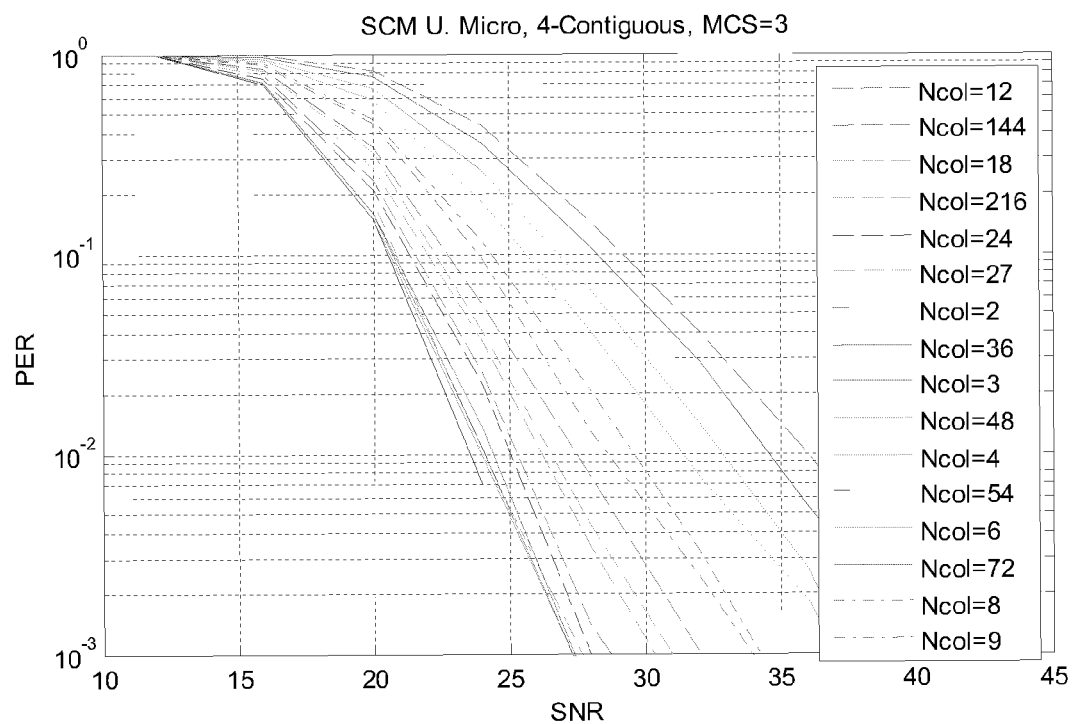
Figure 13:
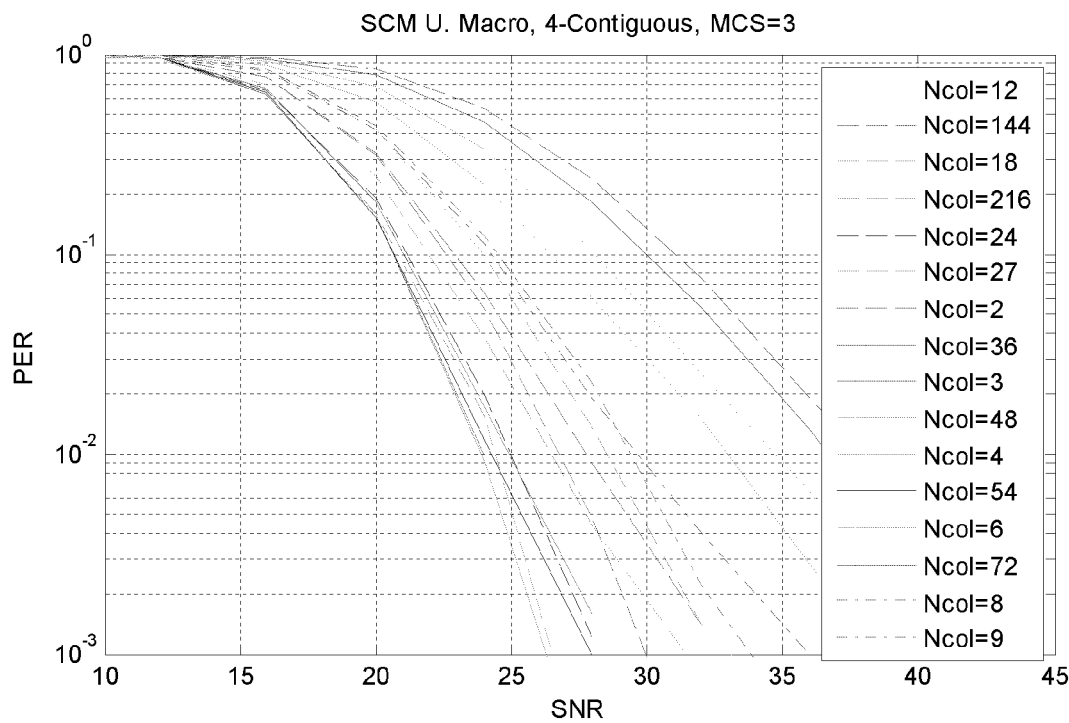
Figure 14:
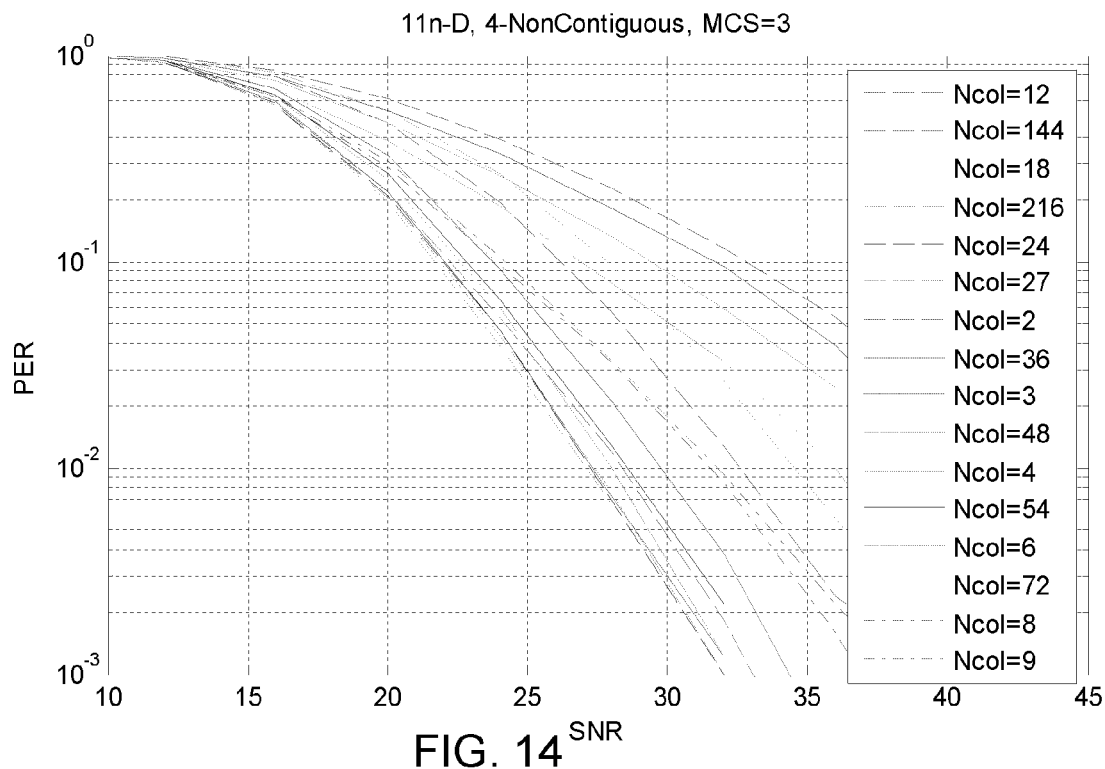
Figure 15:
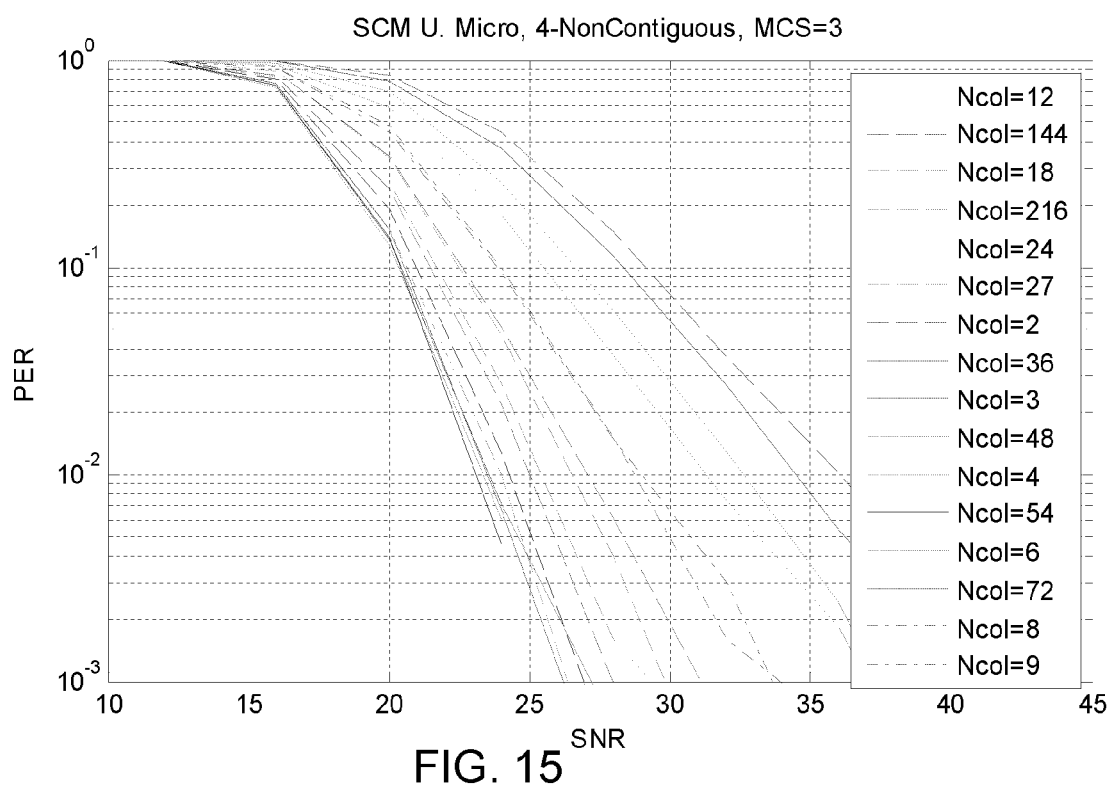

FIG. 7 is a functional block diagram of a MIMO system that may be implemented in wireless devices such as the wireless device of FIG. 2 to transmit and receive wireless communications. Bits to be transmitted are provided to an encoder 704 that may apply a forward error correcting (FEC) code on a bit stream that is to be received at an output of the receiver 202b. The FEC code may be a block code, a convolutional code, or the like. The encoded bits are provided to an interleaving system 705 that distributes its input into M transmit streams.

The following abbreviations may be used below in conjunction with describing the interleaving system:

$N_{CBPS}$: Number of coded bits per symbol;
$N_{CBPSS}(i)$: Number of coded bits per symbol per the i-th spatial stream;
$N_{DBPS}$: Number of data bits per symbol;
$N_{BPSC}$: Number of coded bits per single carrier;
$N_{BPSCS}(i)$: Number of coded bits per single carrier for spatial stream i;
$N_{SS}$: Number of spatial streams;
$i_{SS}$: Spatial stream;
$N_{COL}$: Number of interleaver columns or Interleaving depth ($I_{DEPTH}$);
$N_{ROW}$: Number of interleaver rows; and
$D_n$: Shift in subcarriers for transmitter/spatial stream (TX).

The interleaving system 705 includes a stream parser 706 that parses an input bit stream from the encoder 704 to N spatial stream interleavers 708a, 708b, and 708c. The parser may be provided with the number of spatial streams and parse bits on a round-robin basis. Other parsing functions may also be used. One parsing function that may be used is $k_n = N_{TX}*k+n$ (i.e., round-robin with one bit per spatial stream, then on to the next spatial stream where $k_n$ is the input bit index; and $N_{TX}$ is the number of transmitters/spatial streams). Another more general function f(k,n) might also be used, for example, sending two bits to a spatial stream, then moving on to the next spatial stream. Each interleaver 708a, 708b, and 708c may thereafter distribute bits so that errors may be recovered due to fading or other channel conditions. Hereinafter the interleavers 708a, 708b, and 708c may be referred to an interleaver 708.

In some embodiments, an interleaver 708 may be configured to perform frequency interleaving. The stream parser 705 may output blocks of $N_{CBPSS}(i_{SS})$ bits. Each block may then be interleaved by an interleaver 708 that writes to rows and reads out columns. The number of columns $N_{col}$, or interleaver depth, may be chosen to optimize the ability to recover errors for the particular bandwidth and frequencies used.

OFDM-MIMO transmission may be used for each of one or more 6 MHz TV channels. Timing-related constraints may be according to Table 1 below:

TABLE 1

Timing-related constants

| Parameter | Value | Description |
| --- | --- | --- |
| $N_{SD}$ | 108 | Number of complex data numbers per frequency segment |
| $N_{SP}$ | 6 | Number of pilot values per frequency segment |
| $N_{ST}$ | 114 | Total number of subcarriers per frequency segment |
| $N_{SR}$ | 58 | Highest data subcarrier index per frequency segment |
| $\Delta_F$ | $\frac{6\text{ MHz}}{144} = 41\frac{2}{3}\text{KHz}$ | Subcarrier frequency spacing |
| $T_{DFT}$ | 24 μs | IDFT/DFT period |
| $T_{GI}$ | 6 μs = $T_{DFT}/4$ | Guard interval duration |

In some embodiments, transmission modes using multiple segments is supported. For example, such modes include transmission over two continuous segments (TVHT_MODE_2C), transmission over two non-continuous segments (TVHT_MODE_2N), transmission over four continuous segments (TVHT_MODE_4C), and transmission over four non-continuous segments (TVHT_MODE_4N). The location of the tones for each mode is shown in Table 2 below:

TABLE 2

| Parameter | TVHT_MODE_2C | TVHT_MODE_2N | TVHT_MODE_4C | TVHT_MODE_4N | Description |
|---|---|---|---|---|---|
| $N_{ST}$ | 114 | 114 | 114 | 114 | Total number of occupied subcarriers per frequency segment |
| $N_{TT}$ | 228 | 228 | 456 | 456 | Total number of occupied subcarriers across all frequency segments |
|  | −130 to −74, −70 to −14, +14 to +70, and +74 to +130 | −58 to −2 and +2 to +58 for each frequency segment | −274 to −218, −214 to −158, −130 to −74, −70 to −14, +14 to +70, +74 to +130, +158 to 214, and +218 to +274 | −130 to −74, −70 to −14, +14 to +70, and +74 to +130 for each frequency segment | Location of occupied subcarriers |

In some embodiments, to comply with regulatory standards, only 5.33 MHz of each 6 MHz is used. Within each segment, 108 orthogonal subcarriers (i.e., tones) may be used to transmit data. In some embodiments, other tones may be used for other purposes, such as pilots tones, a DC tone, and guard tones.

The interleaver depth $N_{COL}$ may be optimized for 108 data tones according to various embodiments. In one aspect, the interleaver depth $N_{COL}$ may be chosen to be a factor of the number of data tones (i.e., a factor of 108) according to transmission mode. As such, for two segments (Block size=$N_{SD} \cdot N_{Seg}$=216), the $N_{COL}$ may be selected from the group of 2, 3, 4, 5, 6, 8, 9, 12, 18, 24, 27, 36, 54, 72, and 108. The selected depth $N_{COL}$ may be chosen based on which depth provides the best frequency diversity over the 216 tones to be able to recover the message at the receiver 202b. In addition, for four segments (Block size=$N_{SD} \cdot N_{Seg}$=432), the $N_{COL}$ may be selected from the group of 2, 3, 4, 5, 6, 8, 9, 12, 18, 24, 27, 36, 48, 54, 72, 108, 144, and 216. The selected depth $N_{COL}$ may be chosen based on which depth provides the best frequency diversity over the 432 tones to be able to recover the message at the receiver 202b.

In some embodiments, for two segments (Block size=216), the $N_{COL}$ may be 27, and for four segments (Block size=432), the $N_{COL}$ may be 48. In some embodiments, for two segments (Block size=216), the $N_{COL}$ may be one of 27, 36, 24, 54, 18, 12, 72, and 108, and for four segments (Block size=432), the $N_{COL}$ may be one of 48, 54, 36, 27, 72, 24, 18, and 144. However, other depths may also be used and provide other advantages.

Referring to FIG. 7, the interleaver 708 may take in coded bits in an input sequence from the encoder 704 where the coded bits have indices represent by k (i.e., the bits arrive as k=0, k=1, k=2, etc.). The interleaver may then reorder them so that the bits are output in order by their j index. Using this arrangement, adjacent bits may be separated such that they differ by several subcarriers. For QPSK or higher order constellations there may be 16 bits of difference within a given subcarrier. The interleaving may be defined using three permutations.

The first permutation may be given by Equation 1.

$$i = N_{ROW}(k \bmod N_{COL}) + \text{floor}(k/N_{COL}) k = 0, 1, \ldots, N_{CBPSS}(i_{SS}) - 1 \quad \text{Equ. 1.}$$

As described above, in a first mode, for two segments (Block size=216), the $N_{COL}$ may be selected from the group of 2, 3, 4, 5, 6, 8, 9, 12, 18, 24, 27, 36, 54, 72, and 108 for 216 data tones, and, in a second mode, for four segments (Block size=432), the $N_{COL}$ may be selected from the group of 2, 3, 4, 5, 6, 8, 9, 12, 18, 24, 27, 36, 48, 54, 72, 108, 144, and 216 for 432 data tones.

The second permutation may be given by Equation 2.

$$j = s(i_{SS}) \times \text{floor}(i/s(i_{SS})) + (i + N_{CBPSS}(i_{SS}) - \text{floor}(N_{COL} \times i/N_{BPSCS}(i_{SS}))) \bmod s(i_{SS}); i = 0, 1, \ldots, N_{CBPSS}(i_{SS}) - 1 \quad \text{Equ. 2}$$

The value of $s(i_{SS})$ may be determined by the number of coded bits per subcarrier. If more than one spatial stream exists (i.e., $N_{SS}>1$), the interleaver 708 may perform frequency rotation in a third permutation.

The frequency rotation may be applied after the second permutation as shown in Equation 3.

$$r = \left(j - \left(((i_{SS} - 1) \times 2)\bmod 3 + 3 \times \text{floor}\left(\frac{i_{SS} - 1}{3}\right)\right) \times N_{ROT} \times N_{BPSCS}(i_{SS})\right) \bmod N_{CBPSS}(i_{SS}); \quad \text{Equ. 3}$$

$$j = 0, 1, \ldots, N_{CBPSS}(i_{SS}) - 1$$

where $i_{SS}$ is the index of the spatial stream on which the interleaver is operating and $N_{ROT}$ defines the base subcarrier rotation.

Frequency rotation may be defined where subcarrier rotation $D_n$ (i.e., coded data in the block where each interleaver begins) is a function of the base subcarrier rotation $N_{ROT}$ and interleaved rotation indexes "rot" as given by the equation $D_n = N_{ROT} * \text{rot}$. This defines where in the matrix (made up of the rows and columns as described above) output from the second permutation each spatial stream begins for transmitting values on each available data tone and corresponding frequency.

In accordance with one embodiment, the values for base subcarrier rotation $N_{ROT}$ and rotation indexes rot may be determined for use with two or four segment transmission. The values may be optimized for 216 or 432 data tones to provide improved frequency diversity and to ensure that originally adjacent coded bits are interspersed both between spatial streams and frequency. For two segment transmission, 216 data tones, the base subcarrier rotation $N_{rot}$ may be from 1 to 54, and for four segment transmission, 432 data tones, the base subcarrier rotation $N_{rot}$ may be from 1 to 108. In some embodiments, for two segment transmission, the base subcarrier rotation $N_{rot}$ is 46, and for four segment transmission, the base subcarrier rotation $N_{rot}$ is 78. In some embodiments, for two segment transmission, the base subcarrier rotation $N_{rot}$ is one of 46, 54, 50, 34, 42, 45, 21, 30, 52, 43, 49, 41, 24, 25, and 38, and for four segment transmission, the base subcarrier rotation $N_{rot}$ is one of 78, 94, 101, 66, 75, 79, 87, 93, 91, 106, 70, 76, 98, and 100.

Assuming up to four spatial streams, the interleaved rotation indexes rot may be rot=[0 2 1 3] where each index corresponds to a different spatial stream. The rotation indexes may be determined to ensure that data within the block at which each interleaver starts to map to the corresponding data tones are separated by the maximum distance given a varying number of spatial streams. The indexes [0 2 1 3] may be determined by a bit reversal operation such that neighboring stream pairs (streams 1, 2, 3, and 4) are maximally separated in frequency. As such, if the $N_{rot}$ is chosen to be 4, the interleaver 708 for the first spatial stream may map the bits corresponding to the first position of its block output by the second permutation to the first data tone according to the equation $D_n = N_{ROT} * \text{rot}$ (i.e., 4*0). For a second spatial stream, assuming $N_{ROT}=4$, the subcarrier rotation would be 4*2 or 8. As such, the interleaver 708 for the second spatial stream may map the bits corresponding the $9^{th}$ position of its block to the first data tone for that spatial stream. For a third spatial stream, assuming $N_{ROT}=4$, the subcarrier rotation would be 4*1, or 4. As such the interleaver 408 for the third spatial stream may map the bits corresponding to the $5^{th}$ position of its block to the first data tone. Finally, the fourth spatial stream would map the bits corresponding the $13^{th}$ position of the block to the first data tone.

In a first mode, for two segment transmission, $N_{rot}=46$ may provide improved performance in most cases when the number of spatial streams is greater than one and with $N_{COL}=27$. As such, the subcarrier rotation may be equal to 46*[0 2 1 3]. As such, if the $N_{rot}$ is chosen to be 46, the interleaver 708 for the first spatial stream may map the bits corresponding to the first position of its block output by the second permutation to the first data tone according to the equation $D_n = N_{ROT} * \text{rot}$ (i.e., 46*0)=0. For a second spatial stream, assuming $N_{ROT}=46$, the subcarrier rotation would be 46*2 or 92. As such, the interleaver 708 for the second spatial stream may map the bits corresponding the $93^{rd}$ position of its block to the first data tone for that spatial stream. For a third spatial stream, assuming $N_{ROT}=46$, the subcarrier rotation would be 46*1, or 46. As such, the interleaver 708 for the third spatial stream may map the bits corresponding to the $47^{th}$ position of its block to the first data tone. Finally, the fourth spatial stream would map the bits corresponding the $139^{th}$ position of the block to the first data tone.

In a second mode, for four segment transmission, $N_{rot}=78$ may provide improved performance in most cases when the number of spatial streams is greater than one and with $N_{COL}=48$. As such, the subcarrier rotation may be equal to 78*[0 2 1 3]. As such, if the $N_{rot}$ is chosen to be 78, the interleaver 708 for the first spatial stream may map the bits corresponding to the first position of its block output by the second permutation to the first data tone according to the equation $D_n = N_{ROT} * \text{rot}$ (i.e., 78*0)=0. For a second spatial stream, assuming $N_{ROT}=78$, the subcarrier rotation would be 78*2 or 156. As such, the interleaver 708 for the second spatial stream may map the bits corresponding the $157^{th}$ position of its block to the first data tone for that spatial stream. For a third spatial stream, assuming $N_{ROT}=78$, the subcarrier rotation would be 78*1, or 78. As such, the interleaver 708 for the third spatial stream may map the bits corresponding to the $79^{th}$ position of its block to the first data tone. Finally, the fourth spatial stream would map the bits corresponding the $303^{rd}$ position of the block to the first data tone.

The interleaving system 705 and other corresponding hardware is therefore configured to operate in multiple modes. For example, which mode is used may be based at least in part on the number of available channels. In some implementations, parameters which vary by mode include the block size, the interleaver depth ($N_{COL}$), and the base subcarrier rotation ($N_{rot}$). For example, if two channels are available, a two segment mode may be selected, and the block size may be 216, the interleaver depth may be 27, and the subcarrier rotation may be 46. If four channels are available, a four segment mode may be selected, and the block size may be 432, the interleaver depth may be 48, and the subcarrier rotation may be 78. In some aspects, the mode which is used may be based, at least in part, on the capabilities of the transmitting device and of a receiving device. For example, some receiving devices may be able to operate in a two-channel mode, but not in a four-channel mode. When communicating to such device, a first mode using two channels may be used. However, if a receiving device is capable of receiving in four channels and if four channels are available, a second mode using four channels may be used.

According to the above, therefore, values for $N_{COL}$, $N_{ROT}$, and the rotation indexes rot may be determined for the 2 and 4 segment transmission modes for respective use with 216 and 432 data tones. Various considerations may be used to determined which values to select such as the packet length (e.g., 256 bytes), the MIMO configuration (e.g., 1×1, 2×2 2ss, and 4×4 4ss), the type of channel, or the modulation and coding scheme (e.g., BPSK ½, QPSK ½, 16QAM ½, 64QAM ⅔, 256 QAM ¾). FIGS. 8-15 show examples of simulation results of the performance for various selections of $N_{COL}$ with plots showing the signal-to-noise ratio (SNR) versus the packet error rate (PER). Simulations were performed for various modes (TVHT_MODE_2C, TVHT_MODE_2N, TVHT_MODE_4C, and TVHT_MODE_4N) for various channel models (802.11n D, SCM Urban Micro, and SCM Urban Macro). For the simulations of FIGS. 8-15, MCS 3 was used. Accordingly, for two segment modes 16-QAM, R=½, $N_{BPSCS}=4$, $N_{SC} \cdot N_{Seg}=216$, and $N_{SP}=12$ was used, and for four segment modes 16-QAM, R=½, $N_{BPSCS}=4$, $N_{SD} \cdot N_{Seg}=432$, and $N_{SP}=24$ was used. As shown by the FIGS. 8-11, $N_{COL}=27$ provides best PER performance for two segment transmission. As shown by the FIGS. 12-15, $N_{COL}=48$ provides best PER performance for four segment transmission. Similar simulations using $N_{COL}=27$ show that best PER performance is achieved with $N_{rot}=46$ for two segment transmission. Likewise, simulations using $N_{COL}=48$ show that best PER performance is achieved with $N_{rot}=78$ for four segment transmission. Simulations for MCS 0, MCS 5, and MCS 7 showed similar results.

Table 3 below shows interleaver parameter values for some embodiments:

TABLE 3

| | Interleaver Parameters | | |
|---|---|---|---|
| Parameter | TVHT_MODE_1 | TVHT_MODE_2C TVHT_MODE_2N | TVHT_MODE_4C TVHT_MODE_4N |
| N_COL | 18 | 27 | 48 |
| N_ROW | 6 * N_BPSCS | 8 * N_BPSCS | 9 * N_BPSCS |
| N_ROT | 29 | 46 | 78 |

As shown in FIG. 7, each transmit stream may be modulated by a modulator 702a, 702b, or 702c and passed to a transmission circuit 710a, 710b, or 710c that transmits the modulated transmit stream using antennas 712a, 12b, or 712c, into a wireless radio space using some frequency band such as a television white space and others used for 802.11 transmissions. The bits may be modulated using QPSK (Quaternary Phase Shift Keying) modulation, BPSK (mapping one bit at a time), 16-QAM (mapping group of six bits, and the like. The transmission circuit 710a, 710b, and 710c module may be configured to transmit using a television white space. In some embodiments, the transmit module is configured to transmit using a white space of two television channels, for example, for two segment transmission. In some embodiments, the transmit module is configured to transmit using a white space of four television channels, for example, for four segment transmission.

In some embodiments, antennas 712a, 712b, and 712c are distinct and spatially separated antennas. In other embodiments, distinct signals might be combined into different polarizations off of fewer than M antennas. An example of this is where spatial rotation or spatial spreading is done, where multiple spatial streams are mapped on a single antenna. In any case, it should be understood that distinct spatial streams can be organized in different manners. For example, a transmit antenna might carry data from more than one spatial stream or several transmit antennas might carry data from a spatial stream. For example, consider the case of a transmitter with four transmit antennas and two spatial streams. Each spatial stream can be mapped onto two transmit antennas in that case, so two antennas are carrying data from just one spatial stream.

A receiver 202b receives signals from channel at N antennas 714a, 714b, and 714c (counting separate polarizations, as appropriate) coupled to N receive circuits 716a, 716b, and 716c. The outputs of receive circuits 716a, 716b, and 716c are provided to a MIMO detector 718, which provides its output to a decoder 720, which in turn outputs the received bits which, without unrecoverable errors, are the same as the transmitted bits input to encoder 704. MIMO detector 134 may presumably have the appropriate deinterleaver (not shown). The deinterleaver (not shown) may use operations to perform the reverse operation as described above.

Figure 16:
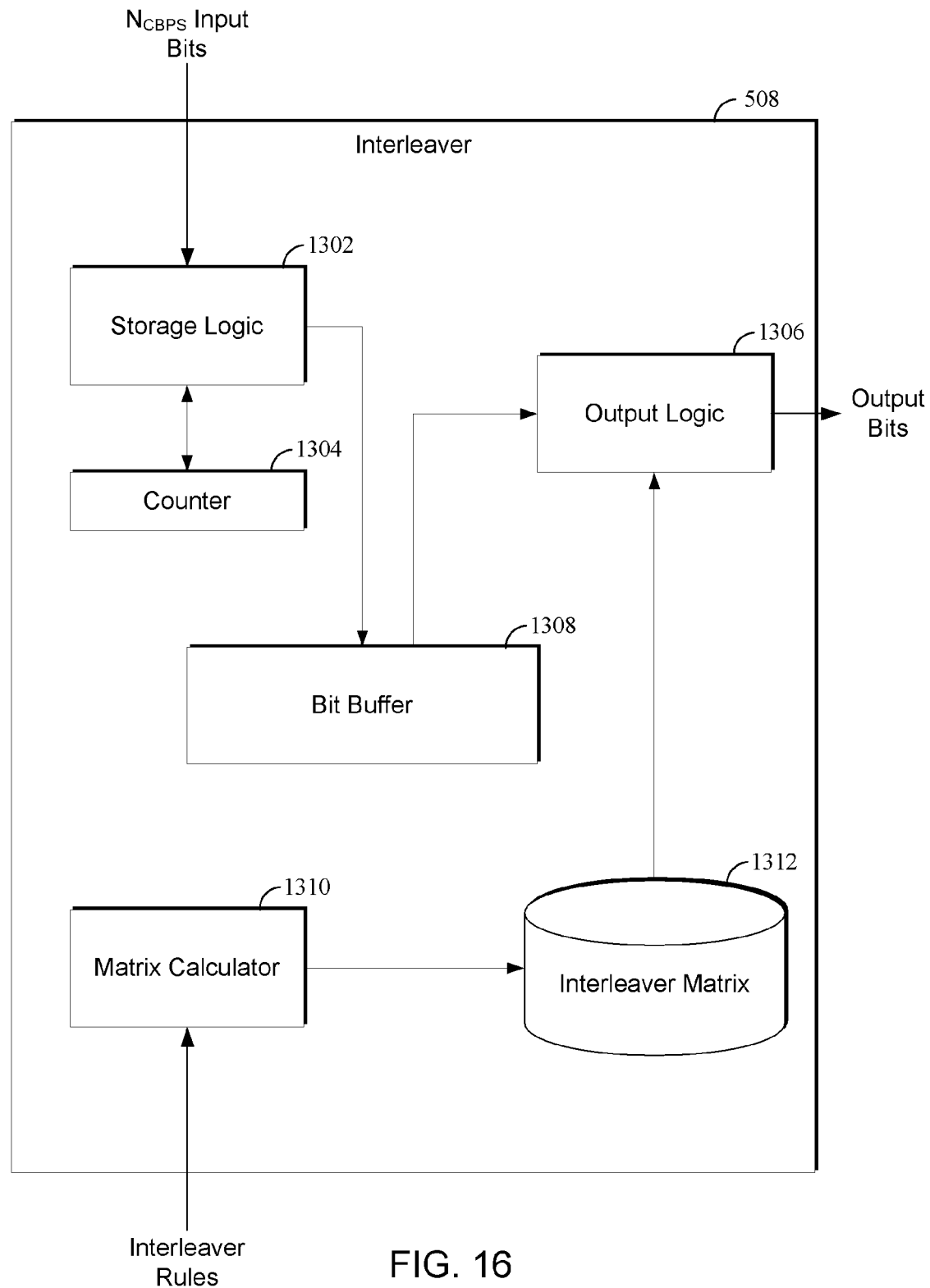
FIG. 16 is a functional block diagram of an exemplary an interleaver of FIG. 7.

FIG. 16 shows a functional block diagram of an exemplary interleaver 708 of FIG. 7. It should be appreciated that multiple interleavers 708a, 708b, and 708c may be combined into a combined structure. As shown, input bits may be received and storage logic 1302 may place the bits in a bit buffer 1308. The locations of bit buffer 1308 may be dictated by a counter 1304 and may typically be such that bits are stored sequentially in the bit buffer 304. Output logic 1306 may read out bits from the bit buffer 1308 and output them for transmission. The order in which the bits are read out is determined by the implementation of the interleaver 708 as described above. The equations shown above may be used to be calculated at each bit, but in some implementations indices may be calculated all at once and stored in a data structure such as a matrix mapping input indices to output indices. Such data might be generated using a matrix calculator 1310 which stores the results in an interleaver matrix 1312 for use by the output logic 1306.

Figure 17:
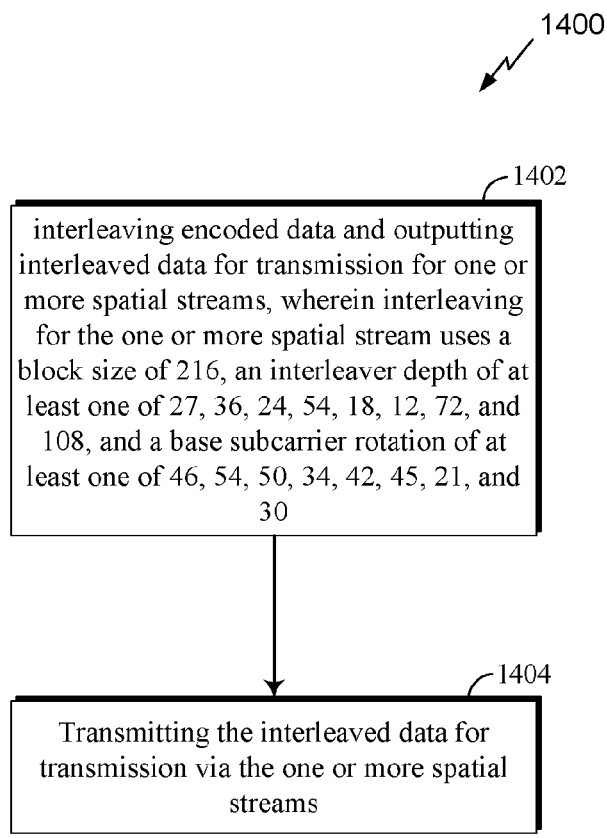
FIG. 17 is a flowchart of an exemplary method for interleaving a bit stream for transmission using two segments.

FIG. 17 shows a flowchart of exemplary method 1400 for interleaving a bit stream for transmission using two segments. In block 1402, the method includes interleaving encoded data and outputting interleaved data for transmission for one or more spatial streams, wherein interleaving for the one or more spatial stream uses a block size of 216, an interleaver depth of at least one of 27, 36, 24, 54, 18, 12, 72, and 108, and a base subcarrier rotation of at least one of 46, 54, 50, 34, 42, 45, 21, 30, 52, 43, 49, 41, 24, 25, and 38. In block 1404, the method further includes transmitting the interleaved bits for transmission via the one or more spatial streams.

Figure 18:
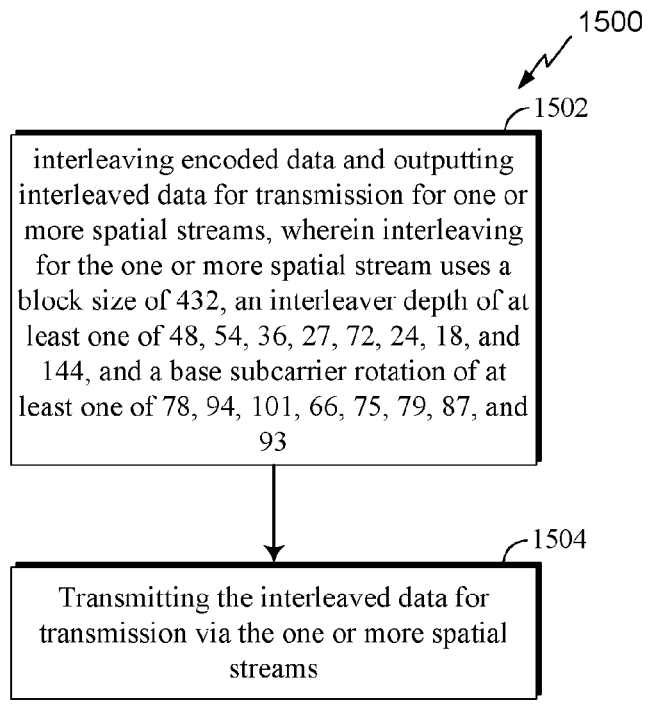
FIG. 18 is a flowchart of an exemplary method for interleaving a bit stream for transmission using two segments.

FIG. 18 shows a flowchart of exemplary method 1500 for interleaving a bit stream for transmission using two segments. In block 1502, the method includes interleaving encoded data and outputting interleaved data for transmission for one or more spatial streams, wherein interleaving for the one or more spatial stream uses a block size of 432, an interleaver depth of at least one of 48, 54, 36, 27, 72, 24, 18, and 144, and a base subcarrier rotation of at least one of 78, 94, 101, 66, 75, 79, 87, 93, 91, 106, 70, 76, 98, and 100. In block 1504, the method further includes transmitting the interleaved bits for transmission via the one or more spatial streams.

Figure 19:
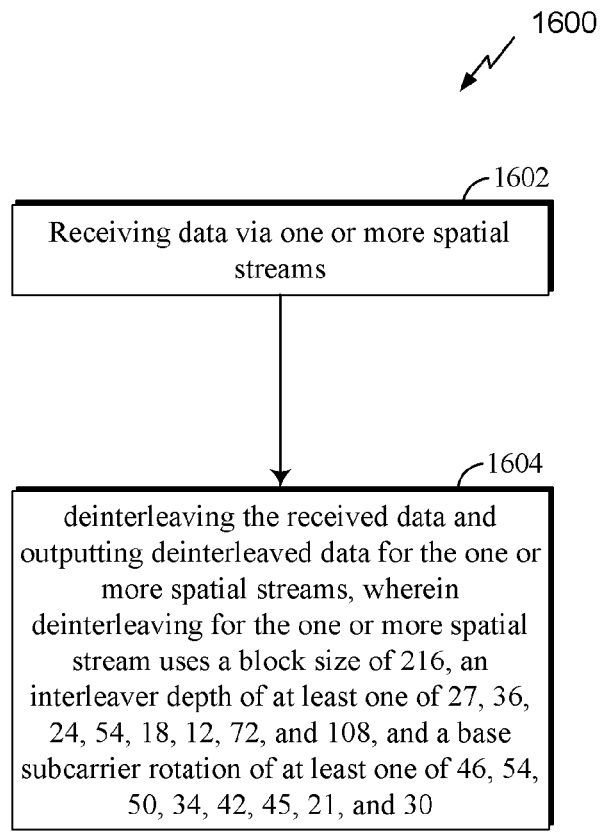
FIG. 19 is a flowchart of an exemplary method for deinterleaving a received bit stream using two segments.

FIG. 19 shows a flowchart of exemplary method 1600 for deinterleaving a received bit stream using two segments. In block 1602, the method includes receiving data via one or more spatial streams. In block 1604, the method further includes deinterleaving the received data and outputting deinterleaved data for the one or more spatial streams, wherein deinterleaving for the one or more spatial stream uses a block size of 216, an interleaver depth of at least one of 27, 36, 24, 54, 18, 12, 72, and 108, and a base subcarrier rotation of at least one of 46, 54, 50, 34, 42, 45, 21, 30, 52, 43, 49, 41, 24, 25, and 38.

Figure 20:
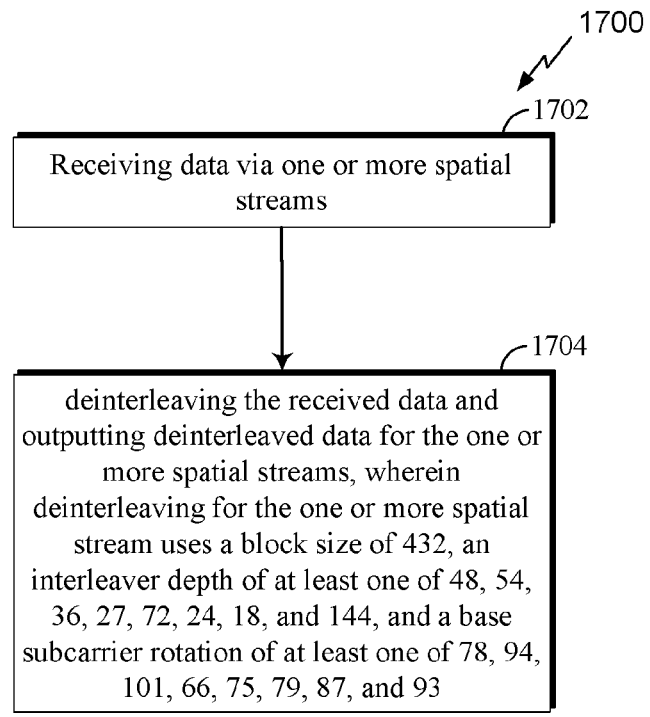
FIG. 20 is a flowchart of an exemplary method for deinterleaving a received bit stream using two segments.

FIG. 20 shows a flowchart of exemplary method 1700 for deinterleaving a received bit stream using two segments. In block 1702, the method includes receiving data via one or more spatial streams. In block 1704, the method further includes deinterleaving the received data and outputting deinterleaved data for the one or more spatial streams, wherein deinterleaving for the one or more spatial stream uses a block size of 432, an interleaver depth of at least one of 48, 54, 36, 27, 72, 24, 18, and 144, and a base subcarrier rotation of at least one of 78, 94, 101, 66, 75, 79, 87, 93, 91, 106, 70, 76, 98, and 100.

Figure 21:
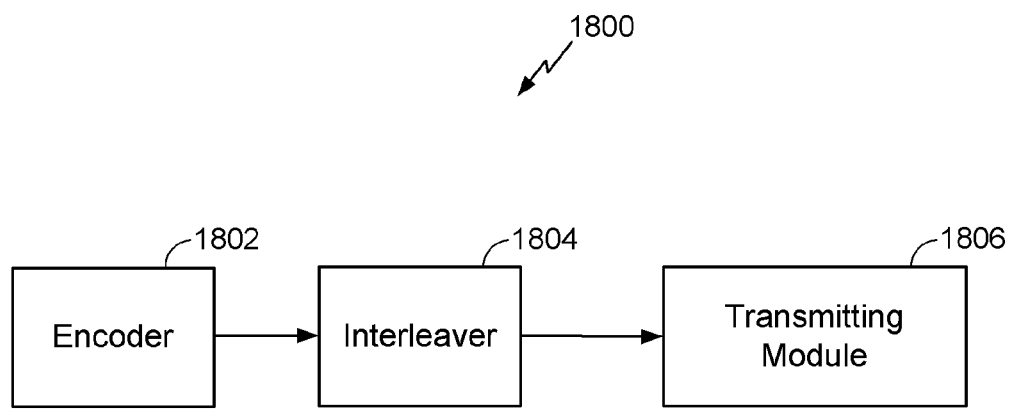
FIG. 21 is a functional block diagram of another exemplary wireless device that may be employed within the wireless communication system of FIG. 1.

FIG. 21 is a functional block diagram of another exemplary wireless device 1800 that may be employed within the wireless communication system 100. Those skilled in the art will appreciate that a wireless communication device may have more components than the wireless communication device shown in FIG. 21. The wireless communication device 1600 shown includes only those components useful for describing some prominent features of certain implementations. The device 1800 includes an encoder 1802 for encoding data for wireless transmission. In some cases a means for encoding may include the encoder 1802. The device 1800 further includes an interleaver 1804 for interleaving the encoded data from the encoder 1802 for transmission. The interleaver 1804 may be configured to perform one or more of the functions discussed above with respect to the blocks 1402 and 1502 illustrated in FIGS. 17 and 18. In some cases a means for interleaving may include the interleaver 1604. The device 1800 further comprises a transmitting module 1806 for wirelessly transmitting the output from the interleaver. The transmitting module 1806 may be configured to perform one or more of the functions discussed above with respect to the blocks 1404 and 1504 illustrated in FIGS. 17 and 18. The transmitting module 1804 may correspond to the transmitter 210. In some cases, a means for transmitting may include the transmitting module 1805. The transmitting module may include a variety of components including, but not limited to, a constellation mapper, a modulator, an IDFT (inverse discrete time Fourier transform module or IFFT 304 as described above with reference to FIG. 3), a digital to analog converter, an amplifier, an antenna, and other components.

Figure 22:
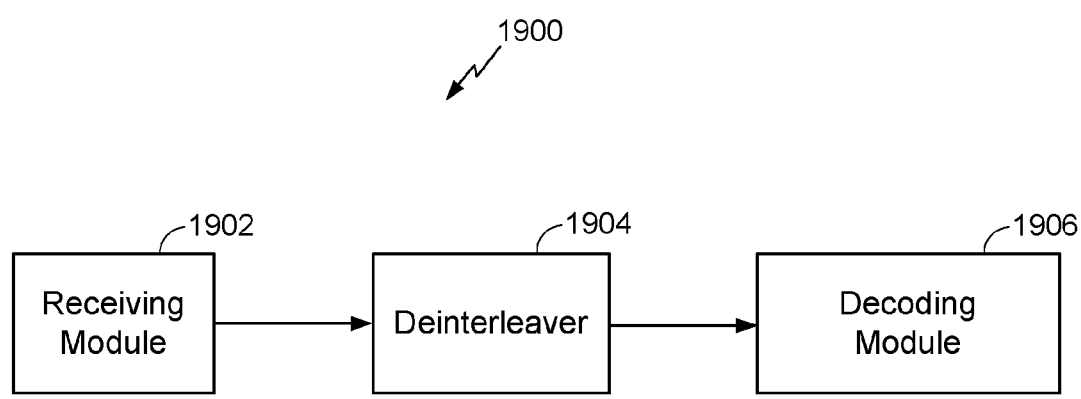
FIG. 22 is a functional block diagram of yet another exemplary wireless device that may be employed within the wireless communication system of FIG. 1.

FIG. 22 is a functional block diagram of yet another exemplary wireless device 1900 that may be employed within the wireless communication system 100. The device 1900 comprises a receiving module 1902 for wirelessly receiving data. The receiving module 1902 may be configured to perform one or more of the functions discussed above with respect to the blocks 1602 and 1702 illustrated in FIGS. 19 and 20. The receiving module 1902 may correspond to the receiver 212, and may include the amplifier 401. In some cases, a means for receiving may include the receiving module 1902. The device 1900 further comprises a deinterleaver 1904 deinterleaving received data. The deinterleaver 1904 may be configured to perform one or more of the functions discussed above with respect to the blocks 1604 and 1704 illustrated in FIGS. 19 and 20. In some cases a means for deinterleaving may include the deinterleaver 1904. The device 1900 further comprises a decoding module 1906 for decoding received and deinterleaved data. In some cases, a means for decoding may include the decoding module 1906.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Thus, in some aspects computer readable medium may comprise non-transitory computer readable medium (e.g., tangible media). In addition, in some aspects computer readable medium may comprise transitory computer readable medium (e.g., a signal). Combinations of the above should also be included within the scope of computer-readable media.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

What is claimed is:

1. A wireless communications apparatus comprising:
a data interleaver configured to interleave an encoded data and to output an interleaved data for transmission for one or more spatial streams, the data interleaver comprising a plurality of spatial stream interleavers configured with at least a first mode and a second mode, the data interleaver comprising a stream parser configured to parse the encoded data to each of the spatial stream interleavers,
wherein in the first mode, the plurality of spatial stream interleavers are configured to set:
a block size equal to 216, the block size for the first mode being set in accordance with a number of frequency segments for the first mode being equal to 2,
an interleaver depth equal to 27, the interleaver depth of the first mode being set as a factor of the block size of the first mode, and
a base subcarrier rotation equal to 46, the base subcarrier rotation for the first mode being set based on the number of frequency segments for the first mode and based on the block size for the first mode; and
wherein in the second mode, the spatial stream interleavers are configured to set:
a block size equal to 432, the block size for the second mode being set in accordance with a number of frequency segments for the second mode being equal to 4,
an interleaver depth equal to 48, the interleaver depth of the second mode being set as a factor of the block size of the second mode, and
a base subcarrier rotation equal to 78, the base subcarrier rotation for the second mode being set based on the number of frequency segments for the second mode and based on the block size for the second mode; and
a transmit module configured to:
select at least one of the first mode and the second mode based at least in part on one or more of:
a number of available channels, such that the number of available channels is equal to the number of frequency segments of the selected mode; and
a capability of a receiving device, such that the receiving device is capable of operating in a number of channels used by the selected mode; and
transmit the interleaved data via the one or more spatial streams, wherein the transmit module is configured to transmit using a white space of two television channels.

2. A method for interleaving data for wireless transmission, the method comprising:
selecting one of a first mode and a second mode based at least in part on one or more of:
a number of available channels, such that the number of available channels is equal to a number of frequency segments of the selected mode; and
a capability of a receiving device, such that the receiving device is capable of operating in a number of channels used by the selected mode;
interleaving an encoded data, outputting an interleaved data for transmission for one or more spatial streams, and parsing the encoded data to each of a plurality of spatial stream interleavers configured with at least the first mode and the second mode, wherein in the first mode interleaving for the one or more spatial streams comprises:
using a block size of 216, the block size for the first mode being set in accordance with the number of frequency segments for the first mode being equal to 2,
using an interleaver depth of 27, the interleaver depth of the first mode being set as a factor of the block size of the first mode, and
using a base subcarrier rotation of 46, the base subcarrier rotation for the first mode being set based on the number of frequency segments for the first mode and based on the block size for the first mode; and wherein in the second mode, interleaving for the one or more spatial stream comprises:
  using a block size of 432, the block size for the second mode being set in accordance with the number of frequency segments for the second mode being equal to 4,
  using an interleaver depth of 48, the interleaver depth of the second mode being set as a factor of the block size of the second mode, and
  using a base subcarrier rotation of 78, the base subcarrier rotation for the second mode being set based on the number of frequency segments for the second mode and based on the block size for the second mode; and
transmitting the interleaved data via the one or more spatial streams using a white space of two television channels.

3. A wireless communications apparatus comprising:
means for selecting one of a first mode and a second mode based at least in part on one or more of:
  a number of available channels, such that the number of available channels is equal to a number of frequency segments of the selected mode; and
  a capability of a means for receiving, such that the means for receiving is capable of operating in a number of channels used by the selected mode;
means for interleaving an encoded data, outputting an interleaved data for transmission for one or more spatial streams, and parsing the encoded data to each of a plurality of spatial stream interleavers configured with at least the first mode and the second mode, wherein in the first mode interleaving for the one or more spatial stream comprises:
  using a block size of 216, the block size for the first mode being set in accordance with the number of frequency segments for the first mode being equal to 2,
  using an interleaver depth of 27, the interleaver depth of the first mode being set as a factor of the block size of the first mode, and
  using a base subcarrier rotation of 46, the base subcarrier rotation for the first mode being set based on the number of frequency segments for the first mode and based on the block size for the first mode; and
wherein in the second mode, interleaving for the one or more spatial stream comprises:
  using a block size of 432, the block size for the second mode being set in accordance with the number of frequency segments for the second mode being equal to 4,
  using an interleaver depth of 48, the interleaver depth of the second mode being set as a factor of the block size of the second mode, and
  using a base subcarrier rotation of 78, the base subcarrier rotation for the second mode being set based on the number of frequency segments for the second mode and based on the block size for the second mode; and
means for transmitting the interleaved data via the one or more spatial streams using a white space of two television channels.

4. A non-transitory computer-readable medium comprising code that, when executed, causes an apparatus to:
select one of a first mode and a second mode based at least in part on one or more of:
  a number of available channels, such that the number of available channels is equal to a number of frequency segments of the selected mode; and
  a capability of a receiving device, such that the receiving device is capable of operating in a number of channels used by the selected mode;
interleave an encoded data, outputting an interleaved data for transmission for one or more spatial streams, and parsing the encoded data to each of a plurality of spatial stream interleavers configured with at least the first mode and the second mode, wherein in the first mode interleaving for the one or more spatial stream comprises:
  using a block size of 216, the block size for the first mode being set in accordance with the number of frequency segments for the first mode being equal to 2,
  using an interleaver depth of 27, the interleaver depth of the first mode being set as a factor of the block size of the first mode, and
  using a base subcarrier rotation of 46, the base subcarrier rotation for the first mode being set based on the number of frequency segments for the first mode and based on the block size for the first mode; and
wherein in the second mode, interleaving for the one or more spatial stream comprises:
  using a block size of 432, the block size for the second mode being set in accordance with the number of frequency segments for the second mode being equal to 4,
  using an interleaver depth of 48, the interleaver depth of the second mode being set as a factor of the block size of the second mode, and
  using a base subcarrier rotation of 78, the base subcarrier rotation for the second mode being set based on the number of frequency segments for the second mode and based on the block size for the second mode; and
transmit the interleaved data via the one or more spatial streams using a white space of two television channels.

5. A wireless communications apparatus comprising:
a receive module configured to receive data via one or more spatial streams over a white space of two television channels; and
a deinterleaver configured to deinterleave the received data, the deinterleaver comprising one or more spatial stream deinterleavers corresponding to one or more spatial streams configured with at least a first mode and a second mode, at least one of the first mode and the second mode being based at least in part on one or more of:
  a number of available channels, such that the number of available channels is equal to a number of frequency segments of the selected mode; and
  a capability of the receive module, such that the receive module is capable of operating in a number of channels used by the selected mode,
wherein in the first mode, the one or more spatial stream deinterleavers are configured to set:
  a block size equal to 216, the block size for the first mode being set in accordance with the number of frequency segments for the first mode being equal to 2,
  an interleaver depth equal to 27, the interleaver depth of the first mode being set as a factor of the block size of the first mode, and a base subcarrier rotation equal to 46, the base subcarrier rotation for the first mode being set based on the number of frequency segments for the first mode and based on the block size for the first mode; and wherein in the second mode, the one or more spatial stream deinterleavers are configured to set:
  a block size equal to 432, the block size for the second mode being set in accordance with the number of frequency segments for the second mode being equal to 4,
  an interleaver depth equal to 48, the interleaver depth of the second mode being set as a factor of the block size of the second mode, and
  a base subcarrier rotation equal to 78, the base subcarrier rotation for the second mode being set based on the number of frequency segments for the second mode and based on the block size for the second mode.

6. A method for deinterleaving data, the method comprising:
  receiving, at a receiver, data via one or more spatial streams over a white space of two television channels; and
  deinterleaving the received data and outputting deinterleaved data for the one or more spatial streams in at least one of a first mode and a second mode, at least one of the first mode and the second mode being based at least in part on one or more of:
    a number of available channels, such that the number of available channels is equal to a number of frequency segments of the selected mode; and
    a capability of the receiver, such that the receiver is capable of operating in a number of channels used by the selected mode,
  wherein deinterleaving for the one or more spatial stream in the first mode comprises:
    using a block size of 216, the block size for the first mode being set in accordance with the number of frequency segments for the first mode being equal to 2,
    using an interleaver depth of 27, the interleaver depth of the first mode being set as a factor of the block size of the first mode, and
    using a base subcarrier rotation of 46, the base subcarrier rotation for the first mode being set based on the number of frequency segments for the first mode and based on the block size for the first mode;
  and wherein deinterleaving for the one or more spatial stream in the second mode comprises:
    using a block size of 432, the block size for the second mode being set in accordance with the number of frequency segments for the second mode being equal to 4,
    using an interleaver depth of 48, the interleaver depth of the second mode being set as a factor of the block size of the second mode, and
    using a base subcarrier rotation of 78, the base subcarrier rotation for the second mode being set based on the number of frequency segments for the second mode and based on the block size for the second mode.

7. A wireless communications apparatus comprising:
  means for receiving data via one or more spatial streams over a white space of two television channels; and
  means for deinterleaving data configured to deinterleave the received data, the means for deinterleaving comprising one or more means for deinterleaving streams corresponding to one or more spatial streams configured with at least a first mode and a second mode, at least one of the first mode and the second mode being based at least in part on one or more of:
    a number of available channels, such that the number of available channels is equal to a number of frequency segments of the selected mode; and
    a capability of the means for receiving, such that the means for receiving is capable of operating in a number of channels used by the selected mode,
  wherein in the first mode the one or more means for deinterleaving streams are configured to set:
    a block size equal to 216, the block size for the first mode being set in accordance with the number of frequency segments for the first mode being equal to 2,
    an interleaver depth equal to 27, the interleaver depth of the first mode being set as a factor of the block size of the first mode, and
    a base subcarrier rotation equal to 46, the base subcarrier rotation for the first mode being set based on the number of frequency segments for the first mode and based on the block size for the first mode;
  and wherein in the second mode the one or more means for deinterleaving streams are configured to set:
    a block size equal to 432, the block size for the second mode being set in accordance with the number of frequency segments for the second mode being equal to 4,
    an interleaver depth equal to 48, the interleaver depth of the second mode being set as a factor of the block size of the second mode, and
    a base subcarrier rotation equal to 78, the base subcarrier rotation for the second mode being set based on the number of frequency segments for the second mode and based on the block size for the second mode.

8. A non-transitory computer-readable medium comprising code that, when executed, causes an apparatus to:
  receive, at a receiver, data via one or more spatial streams over a white space of two television channels; and
  deinterleave the received data and output deinterleaved data for the one or more spatial streams in at least one of a first mode and a second mode, at least one of the first mode and the second mode being based at least in part on one or more of:
    a number of available channels, such that the number of available channels is equal to a number of frequency segments of the selected mode; and
    a capability of the receiver, such that the receiver is capable of operating in a number of channels used by the selected mode,
  wherein deinterleaving for the one or more spatial stream in the first mode comprises:
    using a block size of 216, the block size for the first mode being set in accordance with the number of frequency segments for the first mode being equal to 2,
    using an interleaver depth of 27, the interleaver depth of the first mode being set as a factor of the block size of the first mode, and
    using a base subcarrier rotation of 46, the base subcarrier rotation for the first mode being set based on the number of frequency segments for the first mode and based on the block size for the first mode,
  and wherein deinterleaving for the one or more spatial stream in the second mode comprises:

using a block size of 432, the block size for the second mode being set in accordance with the number of frequency segments for the second mode being equal to 4, using an interleaver depth of 48, the interleaver depth of the second mode being set as a factor of the block size of the second mode, and using a base subcarrier rotation of 78, the base subcarrier rotation for the second mode being set based on the number of frequency segments for the second mode and based on the block size for the second mode.

* * * * *